US012438516B2

(12) United States Patent
Ghosh et al.

(10) Patent No.: US 12,438,516 B2
(45) Date of Patent: Oct. 7, 2025

(54) RESONATOR AND METHOD OF FORMING THE SAME

(71) Applicant: AGENCY FOR SCIENCE, TECHNOLOGY AND RESEARCH, Singapore (SG)

(72) Inventors: Sagnik Ghosh, Singapore (SG); Eldwin Jiaqiang Ng, Singapore (SG); Jaibir Sharma, Singapore (SG); Srinivas Merugu, Singapore (SG)

(73) Assignee: AGENCY FOR SCIENCE, TECHNOLOGY AND RESEARCH, Singapore (SG)

( * ) Notice: Subject to any disclaimer, the term of this patent is extended or adjusted under 35 U.S.C. 154(b) by 199 days.

(21) Appl. No.: 18/548,275

(22) PCT Filed: Mar. 22, 2021

(86) PCT No.: PCT/SG2021/050151
§ 371 (c)(1),
(2) Date: Aug. 29, 2023

(87) PCT Pub. No.: WO2022/203590
PCT Pub. Date: Sep. 29, 2022

(65) Prior Publication Data
US 2024/0137001 A1    Apr. 25, 2024
US 2024/0235522 A9    Jul. 11, 2024

(51) Int. Cl.
*H03H 9/13* (2006.01)
*H03H 3/02* (2006.01)
*H03H 9/17* (2006.01)

(52) U.S. Cl.
CPC ............... *H03H 9/13* (2013.01); *H03H 3/02* (2013.01); *H03H 9/17* (2013.01)

(58) Field of Classification Search
CPC .......... H03H 9/17; H03H 9/2457; H03H 9/13; H03H 9/02275; H03H 3/02; H03H 3/007;
(Continued)

(56) References Cited

U.S. PATENT DOCUMENTS 9,090,451 B1    7/2015  Pan et al.
9,705,470 B1 *  7/2017  Doll ...................... H10N 30/04
(Continued)

FOREIGN PATENT DOCUMENTS

CN    110113022 A    8/2019
EP      2603976 B1    7/2014
(Continued)

OTHER PUBLICATIONS

International Patent Application No. PCT/SG2021/050151; Int'l Search Report and Written Opinion; dated Jun. 17, 2021; 9 pages.
(Continued)

*Primary Examiner* — Quan Tra
*Assistant Examiner* — Anh-Quan Tra
(74) *Attorney, Agent, or Firm* — BakerHostetler

(57) ABSTRACT

Various embodiments may relate to a resonator. The resonator may include a support including a substrate portion, and a membrane portion extending from the substrate portion over a cavity. The resonator may also include a piezoelectric layer on the membrane portion. The resonator may further include an electrode on the piezoelectric layer. The substrate portion may include dopants of a first conductivity type. The membrane portion may include dopants of a second conductivity type different from the first conductivity type. A ratio of a thickness of the membrane portion to a combined thickness of the electrode and the piezoelectric layer may be above 3:1 for temperature compensation.

20 Claims, 22 Drawing Sheets

(58) Field of Classification Search
CPC . H03H 2009/02496; H03H 2009/0244; H03H 2009/02511

See application file for complete search history.

(56) References Cited

U.S. PATENT DOCUMENTS

| | | |
|---|---|---|
| 9,837,981 B2 | 12/2017 | Jaakkola et al. |
| 2009/0302716 A1 | 12/2009 | Ohara et al. |
| 2010/0327701 A1 | 12/2010 | Grannen et al. |
| 2011/0284995 A1 | 11/2011 | Kuypers et al. |
| 2015/0244347 A1 | 8/2015 | Feng et al. |
| 2016/0099704 A1 | 4/2016 | Jaakkola et al. |
| 2018/0001640 A1* | 1/2018 | Eid .............. B41J 2/14233 |
| 2019/0127214 A1 | 5/2019 | Paci et al. |
| 2019/0141456 A1* | 5/2019 | Dogiamis ............. B06B 1/0625 |
| 2022/0413135 A1* | 12/2022 | Gorman .............. G01S 7/52023 |
| 2024/0154598 A1* | 5/2024 | Wu ..................... H03H 9/2463 |
| 2024/0339985 A1* | 10/2024 | Saarela ................ H03H 3/0076 |

FOREIGN PATENT DOCUMENTS

| | | |
|---|---|---|
| JP | 2003-289235 A | 10/2003 |
| WO | WO 2015/122840 A1 | 8/2015 |

OTHER PUBLICATIONS

Shahmohammadi et al.; "Temperature-Compensated Extensional-Mode MEMs Resonators on Highly N-Type Doped Silicon Substrates"; Proc. Solid State Sensors, Actuators and Microsystems Workshop; Jun. 2012; p. 371-374.

Melamud et al.; "Temperature-compensated high-stability silicon resonators"; Applied Physics Letters; vol. 90; 2007; p. 244107-1-244107-3.

Samarao et al.; "Temperature Compensation of Silicon Micromechanical Resonators via Degenerate Doping"; IEEE Int'l Electron Devices Meeting; 2009; p. 789-792.

Shchepetov et al.; "Ultra-thin free-standing single crystalline silicon membranes with strain control"; Applied Physics Letters; vol. 102; 2013; p. 192108-1-192108-4.

Elkhativ et al.; "Process Induced Stresses in Cavity SOI Wafers"; ECS Transactions; vol. 33; 2010; p. 543-552.

Ng et al.; "Temperature Dependence of the Elastic Constants of Doped Silicon"; Journal of Microelectromechanical Systems; vol. 24 No. 3; Jun. 2015; p. 730-741.

Bruls et al.; "The temperature dependence of the Young's modulus of MgSiN2, AlN and Si3N4"; Journal of the European Ceramic Society; vol. 21; 2001; p. 263-268.

Mizushima et al.; "Empty-space-in-silicon technique for fabricating a silicon-on-nothing structure"; Applied Physics Letters; vol. 77 No. 20; Nov. 2000; p. 3290-3292.

Jiang et al.; "Ultrasonic Fingerprint Sensor With Transmit Beamforming Based on a PMUT Array Bonded to CMOS Circuitry"; IEEE Transactions on Ultrasonics, Ferroelectrics and Frequency Control; vol. 64 No. 9; Sep. 2017; p. 1401-1408.

Sato et al.; "Fabrication of Silicon-on-Nothing Structure by Substrate Engineering Using the Empty-Space-in-Silicon Formation Technique"; Japanese Journal of Applied Physics; vol. 43 No. 1; 2004; p. 12-18.

Lin et al.; "Temperature-Compensated Aluminum Nitride Lamb Wave Resonators"; IEEE Transactions on Ultrasonics, Ferroelectrics and Frequency Control; vol. 57 No. 3; Mar. 2010; p. 524-532.

Durand et al.; "Silicon on Nothing MEMs Electromechanical Resonator"; Microsystem Technologies; vol. 14; Mar. 2008; 6 pages.

* cited by examiner

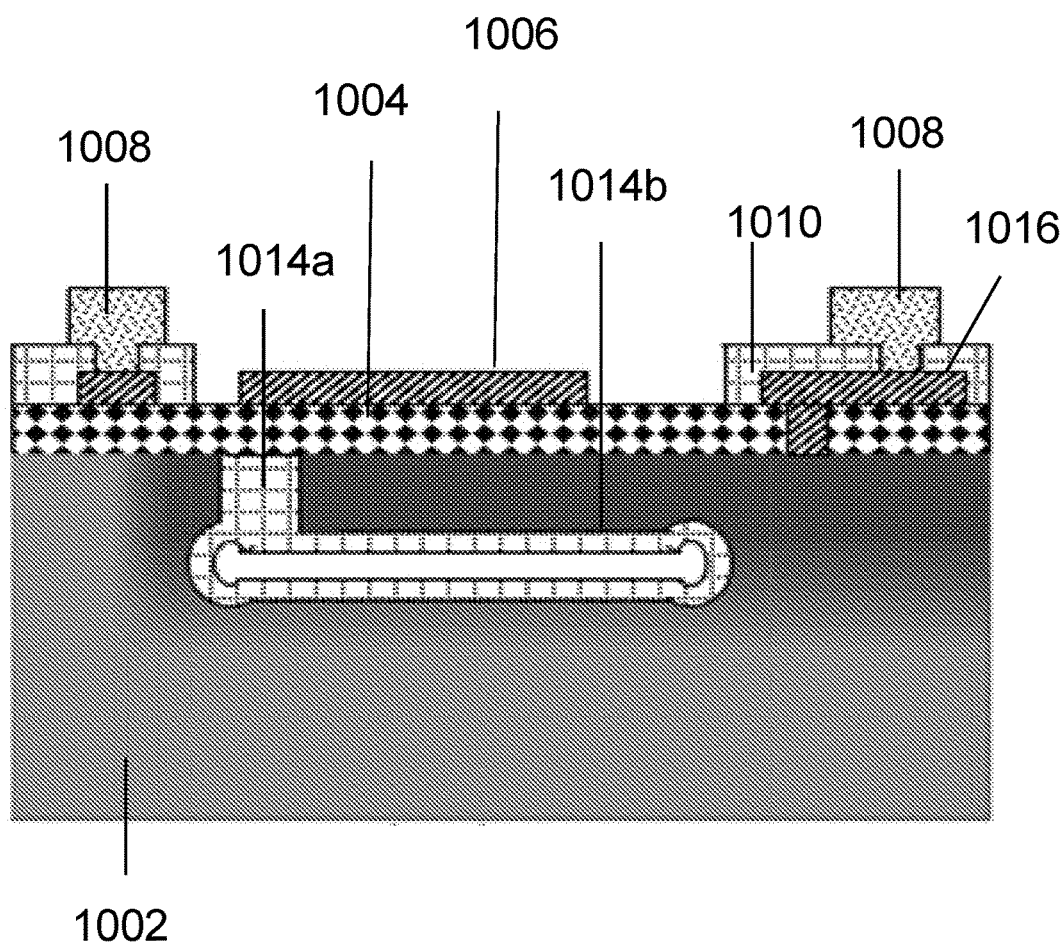

RESONATOR AND METHOD OF FORMING THE SAME

This application is a 371 national stage application of PCT/SG2021/050151 filed Mar. 22, 2021, the entire disclosure of which is referenced herein in its entirety.

TECHNICAL FIELD

Various aspects of this disclosure relate to a resonator. Various aspects of this disclosure relate to a method of forming a resonator.

BACKGROUND

Resonators have been deployed in communication circuits, microprocessors and signal processing circuits in form of timing and frequency references. Conventional timing and frequency control applications use quartz resonators, surface acoustic waves (SAW) resonators and film bulk acoustic resonators (FBARs). Traditional quartz resonators are relatively large and incompatible with conventional complementary metal oxide semiconductor (CMOS) fabrication processes. Although SAW resonators have already been fabricated using microelectromechanical systems (MEMS) technology (which is compatible with CMOS processing), the large size of SAW resonators provides significant drawback when integrating such resonators within oscillators in smaller packages towards ultra-low power applications. FBARs, on the other hand, have been fabricated using MEMS technology within a relatively smaller footprint. However, the resonant frequency of FBARs is determined by the thickness of the structural layer of these resonators, and typically operates at a high frequency (several GHz), with high power consumption for lower frequency applications. Also, it is challenging to fabricate multi-frequency resonators in a single die.

MEMS piezoelectric-on-silicon resonators have recently been demonstrated as a potential alternative to the above-mentioned conventional resonators owing to their small form-factor, broad range of operating frequency, ability to be monolithically integrated with CMOS circuits and the possibility to be fabricated as a multi-frequency array bank of resonators in a single die. Moreover, the enhanced electromechanical coupling from piezoelectric layer yields a low enough motional impedance (comparable to 50Ω). However, MEMS piezoelectric-on-silicon resonators have a temperature coefficient of frequency (TCF) of around ±30 ppm/° C., which is significantly higher than the TCF of quartz resonators, which can have a zero first order TCF. The TCF of a device quantifies the sensitivity of output frequency of the device across a range of temperatures; industrial applications normally consider temperatures ranging from −40° C. to +85° C. There has been an extensive effort to reduce the TCF for piezoelectric-on-silicon MEMS resonators by either introducing structural materials of opposite temperature coefficients relative to each other (such as silicon oxide) or varying doping concentration within the silicon device layer. Despite significant reduction in TCF values, these two approaches require strict control over the fabrication process, which is a challenge for mass fabrication. More recent methods involve aligning to a specific crystal axis (such as <110> or <100>) of a doped silicon device layer, tuning the doping concentration, introducing silicon oxide in the vertical stack of the resonators, varying the aspect ratio of the resonator, or a combination of two or more such factors to reduce TCF. The temperature compensated piezoelectric-on-silicon MEMS resonators have been fabricated from silicon-on-insulator (SOI) wafers or cavity-SOI (C-SOI) wafers, where the thickness of device layer is fixed for a single substrate. Thin device layers (2-10 μm) are required for Lamb-wave resonators in the range of 100 MHz-1 GHz, and the device layer thickness for SOI and C-SOI wafers typically have a significant variation (±0.5-1 μm). SOI and C-SOI wafers are fabricated by bonding wafers, and yields are typically lower than that of typical thin film processes. Reducing the thickness of a silicon device layer beyond a particular value (which is around ~10 μm) induces significant deformation in the released silicon layer due to residual stress which may be a bottleneck in scaling down the overall device dimensions to achieve sub-GHz reference frequency.

SUMMARY

Various embodiments may relate to a resonator. The resonator may include a support including a substrate portion, and a membrane portion extending from the substrate portion over a cavity. The resonator may also include a piezoelectric layer on the membrane portion. The resonator may further include an electrode on the piezoelectric layer. The substrate portion may include dopants of a first conductivity type. The membrane portion may include dopants of a second conductivity type different from the first conductivity type. A ratio of a thickness of the membrane portion to a combined thickness of the electrode and the piezoelectric layer may be above 3:1 for temperature compensation.

Various embodiments may relate to a method of forming a resonator. The method may include forming a support comprising a substrate portion, and a membrane portion extending from the substrate portion over a cavity. The method may also include forming a piezoelectric layer on the membrane portion. The method may further include forming an electrode on the piezoelectric layer. The substrate portion may include dopants of a first conductivity type. The membrane portion may include dopants of a second conductivity type different from the first conductivity type. A ratio of a thickness of the membrane portion to a combined thickness of the electrode and the piezoelectric layer may be above 3:1 for temperature compensation.

BRIEF DESCRIPTION OF THE DRAWINGS

The invention will be better understood with reference to the detailed description when considered in conjunction with the non-limiting examples and the accompanying drawings, in which:

FIG. 10G shows the removal of a portion of the silicon oxide spacers to expose the top electrode according to various embodiments.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or resonators are analogously valid for the other methods or resonators. Similarly, embodiments described in the context of a method are analogously valid for a resonator, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The device as described herein may be operable in various orientations, and thus it should be understood that the terms "top", "bottom", etc., when used in the following description are used for convenience and to aid understanding of relative positions or directions, and not intended to limit the orientation of the resonator.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

Various embodiments may seek to address or mitigate issues faced by conventional resonators.

Figure 1:
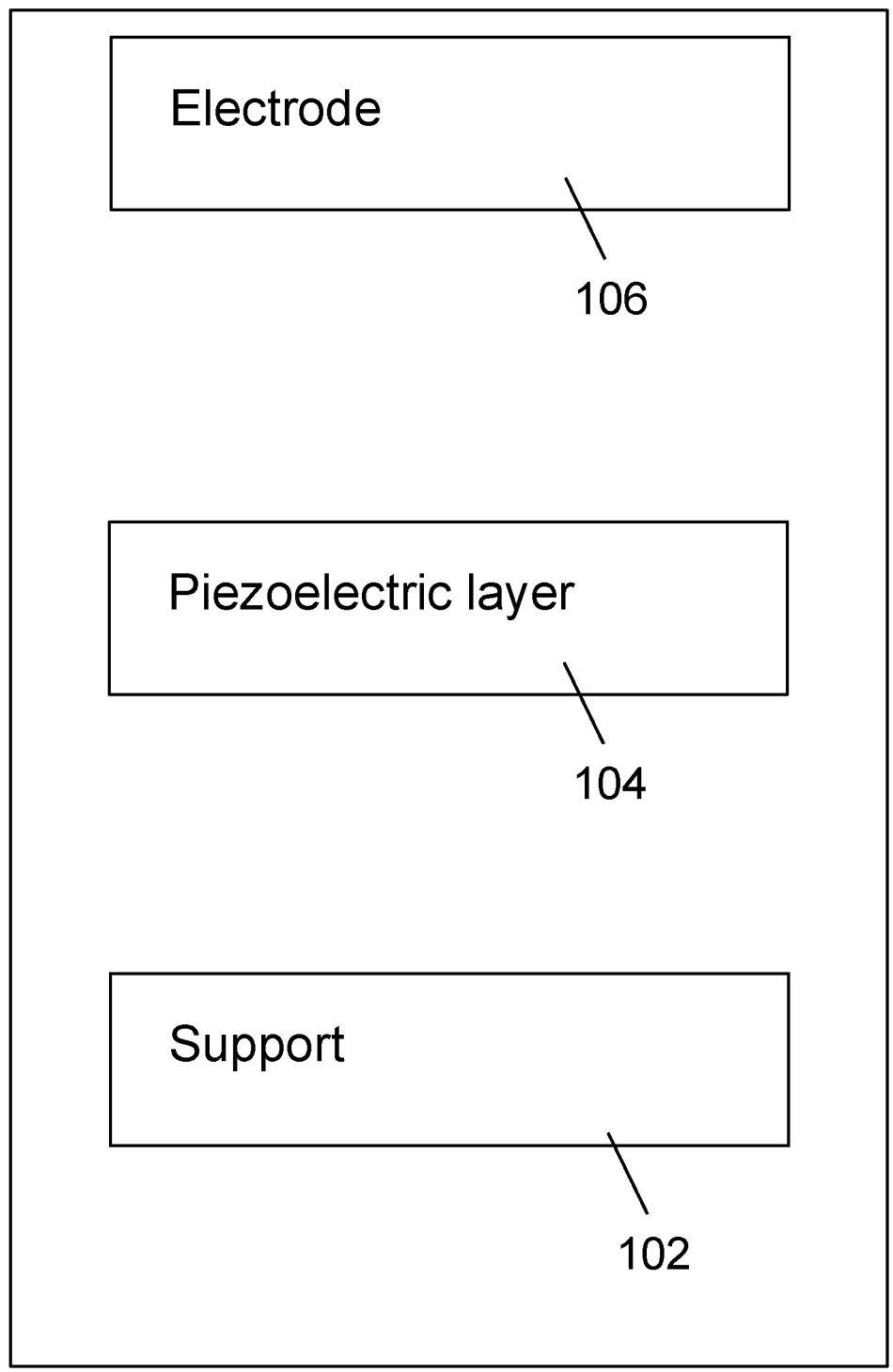
FIG. 1 shows a general illustration of a resonator according to various embodiments.

FIG. 1 shows a general illustration of a resonator according to various embodiments. The resonator may include a support 102 including a substrate portion, and a membrane portion extending from the substrate portion over a cavity. The resonator may also include a piezoelectric layer 104 on the membrane portion. The resonator may further include an electrode 106 on the piezoelectric layer 104. The substrate portion may include dopants of a first conductivity type. The membrane portion may include dopants of a second conductivity type different from the first conductivity type. A ratio of a thickness of the membrane portion to a combined thickness of the electrode 106 and the piezoelectric layer 104 may be above 3:1 for temperature compensation.

In other words, the resonator may include a support 102 with a membrane portion extending over a substrate portion. The substrate portion may be doped with dopants of the first conductivity, while the membrane portion may be doped with dopants of the second conductivity. The resonator may further include a piezoelectric layer 104 and an electrode 106. The membrane portion may be at least three times the sum of the thickness of the electrode 106 and the thickness of the piezoelectric layer 104.

For avoidance of doubt, FIG. 1 seeks to illustrate some of the features of the resonator according to various embodiments, and is not intended to limit the shape, size, arrangement, orientation etc. of the various features.

In various embodiments, the support 102, i.e. the substrate portion and the membrane portion, may include silicon or germanium.

In various embodiments, the support 102 may include one or more electrical isolation structures (also referred to as electrical isolation) separating the substrate portion and the membrane portion. The one or more electrical isolation structures may include an oxide, such as silicon oxide or germanium oxide. The one or more isolation structures may be lateral to the membrane portion. In various embodiments, the one or more isolation structures may be formed by local oxidation of silicon (LOCOS) process. The electrical isolation structures may extend vertically.

In various other embodiments, the substrate portion including dopants of the first conductivity type and the membrane portion including dopants of the second conductivity type form a p-n junction for providing electrical isolation.

In various embodiments, the substrate portion may be p-doped, while the membrane portion may be n-doped. In other words, the first conductivity type may be p-type, while the second conductivity type may be n-type. In various other embodiments, the substrate may be n-doped, while the membrane portion may be p-doped. In other words, the first conductivity type may be n-type, while the second conductivity type may be p-type.

The concentration of dopants in the membrane portion may be higher than the concentration of dopants in the substrate portion. In other words, the membrane portion may be more heavily doped compared to the substrate portion. In various embodiments, a concentration of dopants in the membrane portion may be of a value more than $10^{20}$ cm$^{-3}$, e.g. more than $10^{21}$ cm$^{-3}$. In various embodiments, a concentration of dopants in the substrate portion may be of a value less than $10^{18}$ cm$^{-3}$, e.g. less than $10^{17}$ cm$^{-3}$.

In various embodiments, a region of the substrate portion adjoining the cavity and a region of the membrane portion adjoining the cavity may include an oxide, such as silicon oxide or germanium oxide. In other words, the substrate portion may include an oxide layer adjoining the cavity. The oxide layer may surround the cavity. The oxide layer may extend laterally, and may form a continuous structure with the one or more electrical isolation structures which extends vertically.

In various embodiments, a lateral dimension of the membrane portion may be of a value of 10 μm or greater, e.g. 12 μm or greater. In various embodiments, a height of the cavity may be of a value may be of 0.8 μm or greater. In various embodiments, a thickness of the membrane portion may be of a value less than 2.5 μm.

In various embodiments, a thickness of the membrane portion may vary along one of the lateral dimensions, e.g. a length or a width, of the membrane portion.

In various embodiments, the cavity may at least be partially defined by a bottom surface of the membrane portion and a top surface of the substrate portion.

In various embodiments, the cavity may be formed by a silicon-on-nothing process or a germanium-on-nothing process. The silicon-on-nothing process may include etching trenches from a top surface of a crystalline silicon wafer. Similarly, a germanium-on-nothing process may include etching trenches from a top surface of a crystalline germanium wafer. The etching may be carried out along a thickness of the silicon or germanium wafer from the top surface of the wafer.

In various embodiments, the resonator may be a contour mode resonator. In various other embodiments, the resonator may be a flexural mode resonator. A non-limiting example of a flexural mode resonator is a cantilever resonator.

In various embodiments, a central axis of the resonator may be aligned to a <100> axis of silicon or germanium.

In various embodiments, the membrane portion may act as a further electrode. In various other embodiments, the resonator may further include an electrically conductive layer acting as a further electrode. The piezoelectric layer 104 may be between the electrode 106 and the electrically conductive layer.

Figure 2:
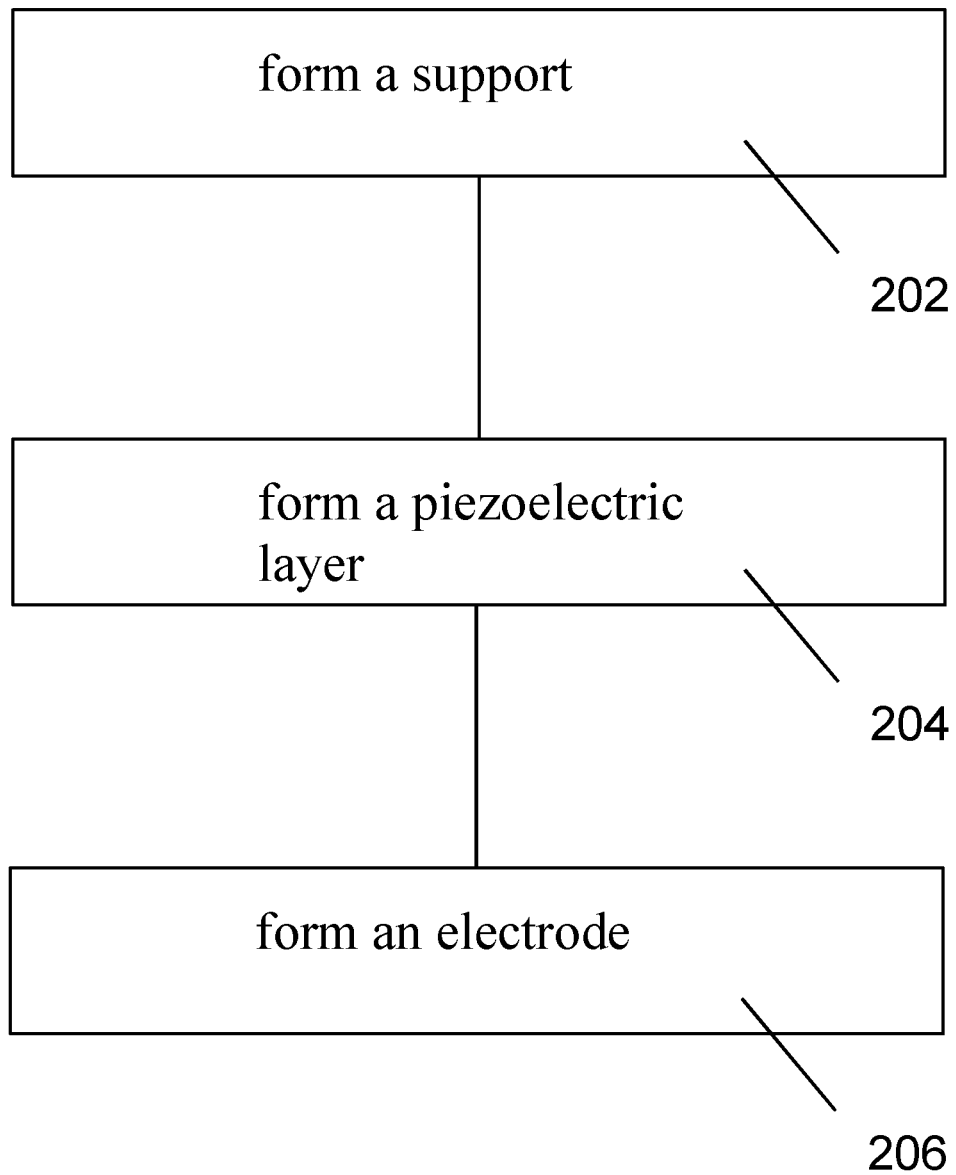
FIG. 2 is a general schematic illustrating a method of forming a resonator according to various embodiments.

FIG. 2 is a general schematic illustrating a method of forming a resonator according to various embodiments. The method may include, in 202, forming a support comprising a substrate portion, and a membrane portion extending from the substrate portion over a cavity. The method may also include, in 204, forming a piezoelectric layer on the membrane portion. The method may further include, in 206, forming an electrode on the piezoelectric layer. The substrate portion may include dopants of a first conductivity type. The membrane portion may include dopants of a second conductivity type different from the first conductivity type. A ratio of a thickness of the membrane portion to a combined thickness of the electrode and the piezoelectric layer may be above 3:1 for temperature compensation.

In other words, the method may include forming the support including the membrane portion and the substrate portion, forming the piezoelectric layer, and forming the electrode.

In various embodiments, forming the support including the substrate portion and the membrane portion may include using a silicon-on-nothing process on a crystalline silicon wafer, or using a germanium-on-nothing process on a crystalline germanium wafer.

In various embodiments, the silicon-on-nothing process or germanium-on-nothing process may include forming an array of pillars via etching. The silicon-on-nothing process or germanium-on-nothing process may further include annealing the array of pillars such that silicon or germanium surface atoms diffuse to form the membrane portion.

In various embodiments, a lateral dimension of the membrane portion may be of a value of 10 μm or greater. In various embodiments, a height of the cavity may be of a value of 0.8 μm or greater.

In various embodiments, the method may include forming one or more electrical isolation structures separating the substrate portion and the membrane portion. The one or more electrical isolation structures may include an oxide, such as silicon oxide or germanium oxide.

In various embodiments, the method may include forming an oxide, e.g. silicon oxide or germanium oxide, in a region of the substrate portion adjoining the cavity and a region of the membrane portion adjoining the cavity. The oxide adjoining the cavity may be formed after forming the one or more electrical isolation structures. The oxide adjoining the cavity may be formed by diffusion of an oxidant, e.g. oxygen, air or water vapor through the one or more electrical isolation structures. The one or more electrical isolation structures may include an oxide, and the oxidant may diffuse through the oxide to the cavity to oxidize regions of the membrane portion and the substrate portion adjoining the enclosed cavity.

Various embodiments may relate to a temperature compensated piezoelectric-on-silicon or piezoelectric-on-germanium MEMS resonator fabricated on a pre-released stress-free thin silicon or germanium membrane of thickness around 2 μm. Moreover, the method of releasing silicon or germanium membrane may provide flexibility of tuning the thickness of the silicon or germanium membrane without alteration of fabrication process steps. The central axis of the resonators, described herein may be aligned substantially close to the <100> crystal axis of a (100) silicon or germanium wafer to reduce the temperature dependence.

The resonant frequency of a MEMS resonator can generally be quantified as follows:

$$f_0 = \frac{1}{2\pi}\sqrt{\frac{k_{eq}}{m_{eq}}} \quad (1)$$

where $k_{eq}$ denotes the effective stiffness of a resonator and $m_{eq}$ is the effective mass. It is worth noting that the piezoelectric-on-silicon or piezoelectric-on-germanium resonators described herein have silicon or germanium device layers that are significantly thinner than those in prior work, and are tailored for higher frequency Lamb-wave resonators. While the temperature coefficient of frequency (TCF) of resonators with thicker silicon or germanium device layers are mostly dominated by the silicon or germanium layer, the temperature dependence of the elastic constants of the piezoelectric layer, electrodes, and other materials in the stack have to be taken into account for the resonators. The variation of resonant frequency with temperature may be expanded in a power series, typically to the third order:

$$f(T)=f_0[1+TCF_1 \times \Delta T+TCF_2 \times \Delta T^2+TCF_3 \times \Delta T^3] \quad (2)$$

Here, $f_0$ denotes the resonant frequency at the reference temperature ($T_0$), while $TCF_1$, $TCF_2$ and $TCF_3$ denote respectively the first, second and third order temperature coefficients of frequency. $\Delta T$ denotes the difference between the respective operating temperature (T) and the reference temperature ($T_0$):

$$\Delta T=T-T_0 \quad (3)$$

It should be noted that the results presented herein has been obtained for T ranging from −40° C. to +85° C. (as required for industrial standards). In order to quantify the temperature stability of a resonator, it is desirable to track the relative change in resonant frequency with respect to the resonant frequency ($f_0$) at reference temperature ($T_0$; which is considered as 25° C. in this study) over the entire operating range of temperature. As such, the following relation in connection to relative change in resonant frequency with T may be used:

$$\frac{\Delta f}{f_0} = \frac{[f(T)-f_0]}{f_0} = TCF_1 \times \Delta T + TCF_2 \times \Delta T^2 + TCF_3 \times \Delta T^3 \quad (4)$$

Figure 3:
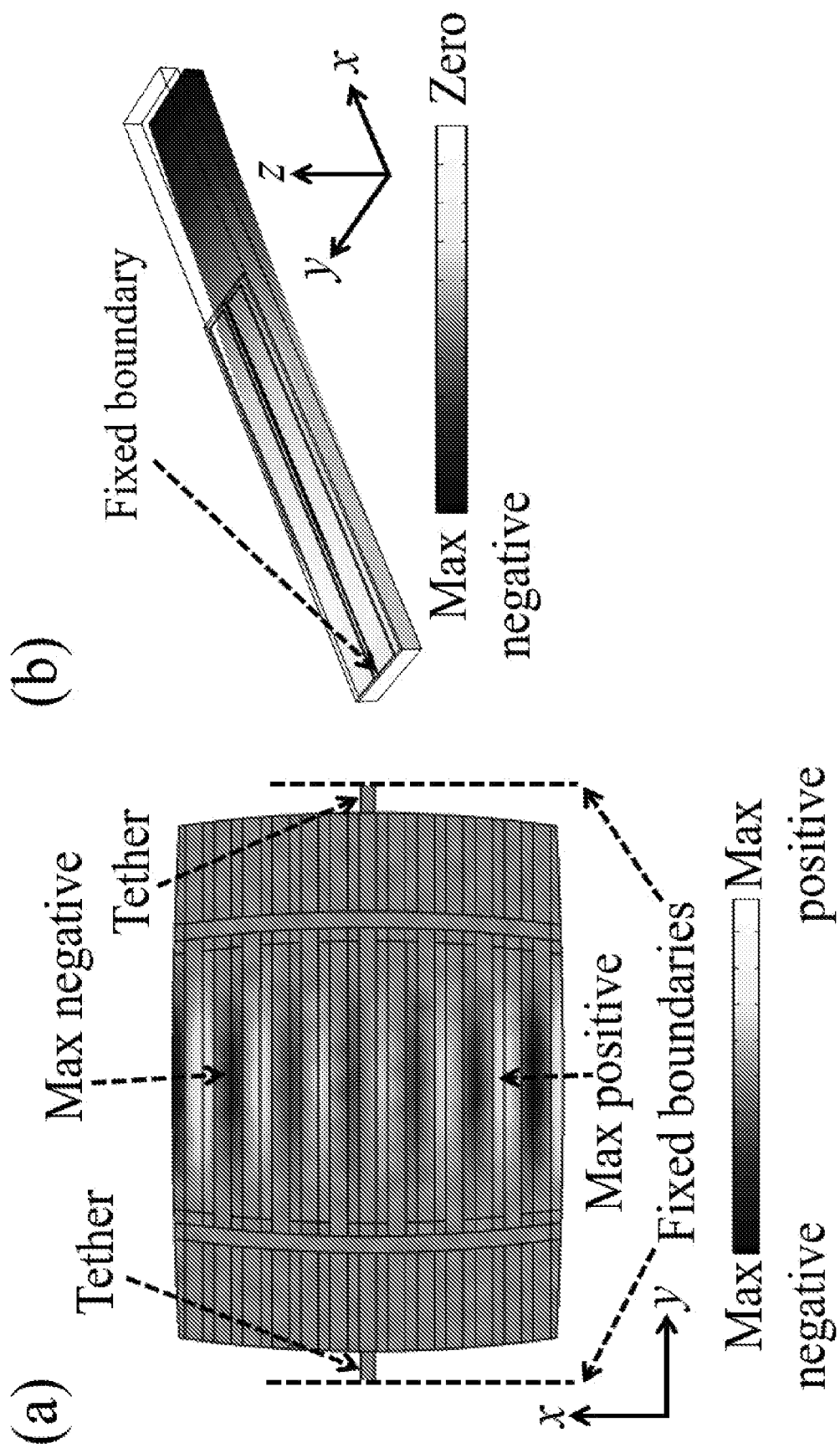
FIG. 3 shows (a) in-plane displacement profile of a contour mode resonator according to various embodiments along the x axis; and (b) out-of-plane displacement profile of a cantilever according to various embodiments along the z axis.

The method of temperature compensation described herein can be applied to both flexural and bulk mode piezoelectric-on-silicon resonators. Examples of the vibration mode shapes for both form of resonators have been described in FIG. 3. FIG. 3 shows (a) in-plane displacement profile of a contour mode resonator according to various embodiments along the x axis; and (b) out-of-plane displacement profile of a cantilever according to various embodiments along the z axis. The displacement profiles are obtained from finite element (FE) simulations using COMSOL Multiphysics. The central axis for both resonators shown in FIG. 3 are designed along <100> crystal plane of single crystalline silicon.

The free-edges of a contour mode resonator in FIG. 3(a) have been curved to limit the containment of acoustic energy around the center of the resonator to reduce the outward flow of acoustic energy through the anchors (which is commonly classified as anchor loss) and enhance the overall quality (Q) factor. In contrast, the lower acoustic losses of thick silicon device layer in conventional thin-film piezoelectric-on-silicon (TPoS) resonators contribute to the overall Q-factor enhancement alongside other losses.

The resonators described herein may be fabricated on pre-released silicon membrane (i.e. membrane portion) which is continuous with the silicon substrate (i.e. substrate portion). A pre-formed cavity (the minimum depth of which is 0.8 μm) separates the silicon membrane from the substrate.

Figure 4:
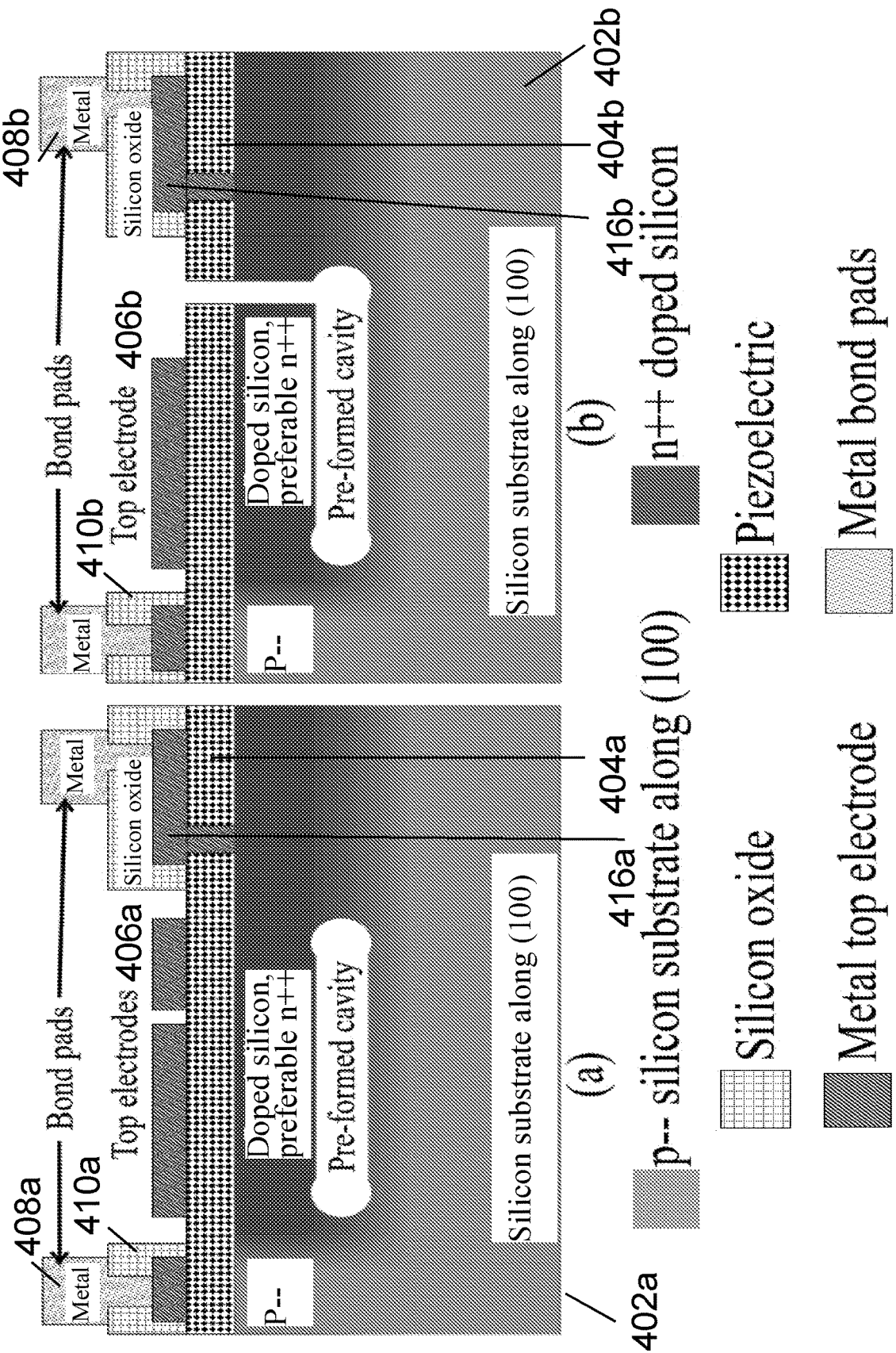
FIG. 4 shows (a) a cross-sectional schematic of a contour mode resonator according to various embodiments, and (b) a cross-sectional schematic of a cantilever resonator according to various embodiments.

FIG. 4 shows (a) a cross-sectional schematic of a contour mode resonator according to various embodiments, and (b) a cross-sectional schematic of a cantilever resonator according to various embodiments. The resonators illustrated in FIG. 4 include also the structural layers fabricated on the silicon membrane. The resonators may each have a support 402a, 402b including a substrate portion and a membrane portion. The membrane portion may be heavily doped with n-type dopants to primarily reduce frequency variation with temperature. The grey level intensities shown in FIG. 4 are intended to show the relative doping concentrations present in the supports 402a, 402b. FIG. 4 shows heavily doped membrane portions designed as the bottom electrode while the substrate portions are lightly doped. However, it may also be envisioned that in various other embodiments, resonators may have a separate bottom metal electrode. Additionally, high frequency resonators (~GHz and sub-GHz contour mode) as well as low frequency (~MHz) flexural mode resonators may be achieved adjacent to each other in this process.

Each resonator may also include a piezoelectric layer 404a, 404b of piezoelectric material, which is sandwiched between the patterned top electrodes 406a, 406b and the bottom electrodes (i.e. membrane portions). The piezoelectric layers 404a, 404b may enhance the effective electromechanical coupling of the resonator while acting as a dielectric between the top electrodes 406a, 406b and the bottom electrodes. Various embodiments may maintain a ratio of above 3:1 for thickness of the membrane portion to the combined thicknesses of both the piezoelectric layer 404a, 404b and the metal electrodes 406a, 406b. In addition, the resonators may have a minimum lateral dimension (along xy-plane) of 10 μm. These resonators may be integrated with CMOS circuits, e.g. by wafer bonding (e.g. using aluminum germanium (AlGe)), to realize an oscillator or radio frequency communication circuit within a small footprint, as well as to create a sealed environment around the resonator for reducing contamination. The resonators may also include metal bond pads 408a, 408b, metal connections 416a, 416b with an oxide spacer 410a, 410b between the metal electrodes 406a, 406b and the metal connections 416a, 416b. The metal connections 416a, 416b may provide electrical connection to the heavily doped membrane portions which serve as the bottom electrodes. The oxide spacer 410a, 410b may also help to minimize the feedthrough capacitance of the resonators. The oxide spacer 410a, 410b may include an oxide, such as silicon oxide. The metal electrodes 406a, 406b and the metal connections 416a, 416b may include a suitable metal such as molybdenum or aluminum.

Figure 5:
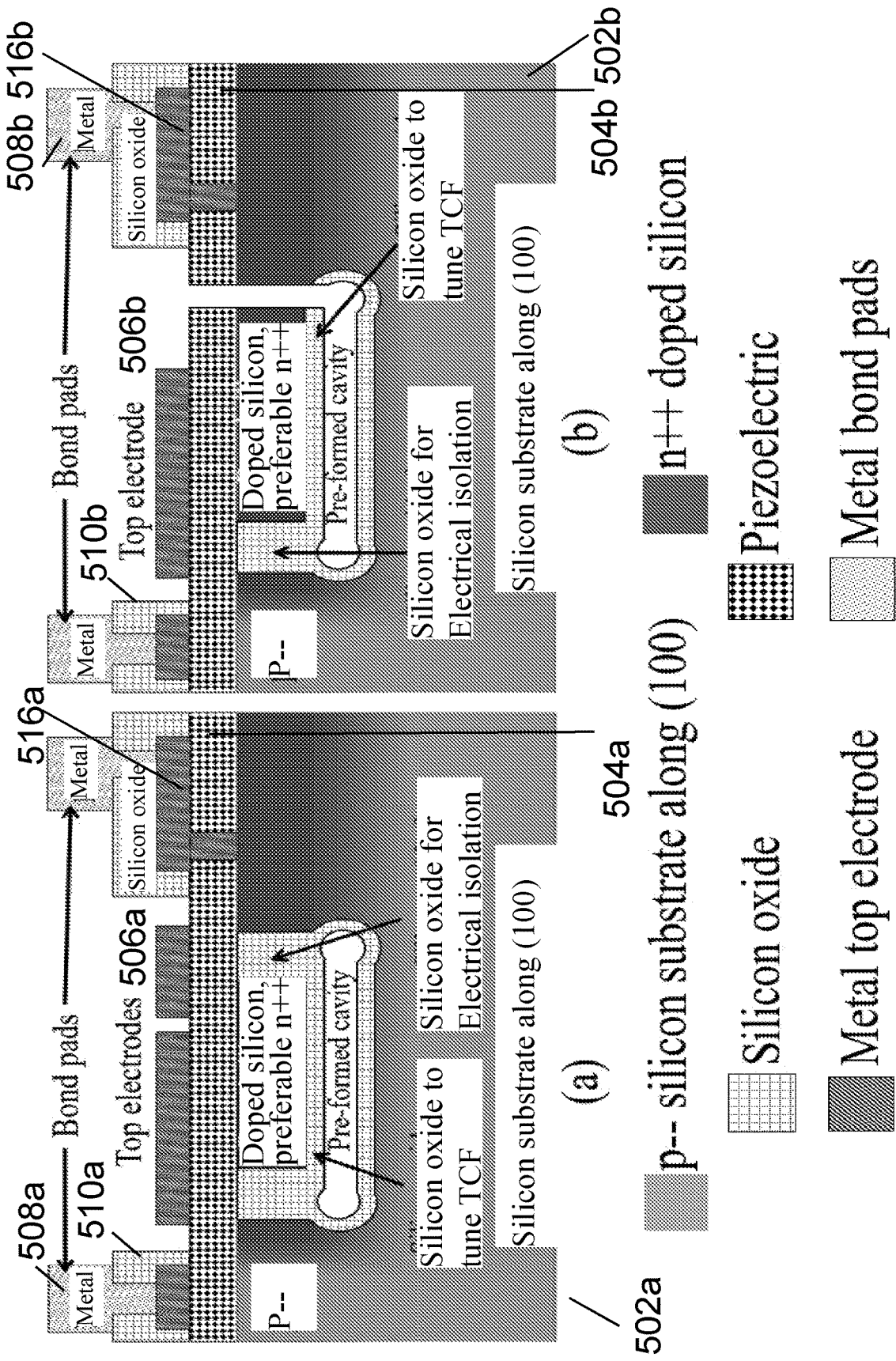
FIG. 5 shows (a) a cross-sectional schematic of a contour mode resonator according to various embodiments, and (b) a cross-sectional schematic of a cantilever resonator according to various embodiments.

The design method described above may create a high resistance p-n junction between the n-type heavily doped silicon membrane portion and the p-type lightly doped silicon substrate portion to maintain a lower capacitance and coupling between devices. However, the resistance of the p-n junction may not be sufficiently high and better electrical isolation may be required. As shown in FIG. 5, silicon oxide may be locally grown around the suspended device for better electrical isolation.

FIG. 5 shows (a) a cross-sectional schematic of a contour mode resonator according to various embodiments, and (b) a cross-sectional schematic of a cantilever resonator according to various embodiments.

As shown in FIG. 5, the contour mode resonator may include a support 502a with a membrane portion and a substrate portion. The contour mode resonator may also include a piezoelectric layer 504a and an electrode 506a, similar to the contour mode resonator shown in FIG. 4. Likewise, the cantilever resonator may include a support 502b with a membrane portion and a substrate portion. The cantilever resonator may further include a piezoelectric layer 504b and an electrode 506b similar to the cantilever resonator shown in FIG. 4. Similar to the resonators shown in FIG. 4, the resonators shown in FIG. 5 may also include metal bond pads 508a, 508b, metal connections 516a, 516b, and oxide spacers 510a, 510b. The support 502a, 502b of the resonators shown in FIG. 5 may additionally include one or more electrical isolation structures including an oxide extending vertically from a surface of the support 502a, 502b adjoining the piezoelectric layer 504a, 504b. The support 502a, 502b may include an oxide layer adjoining the cavity. The oxide layer may be at the surface of the membrane portion facing the cavity. The oxide layer and the one or more electrical isolation layers may form a continuous structure.

Given the negative 2nd order TCF of silicon oxide relative to positive 2nd order TCF of the doped membrane portion (also referred to as a silicon device layer), growing a layer of silicon oxide in the vertical stack on the cavity side may aid in the reduction of the overall 2nd order TCF of the resonator. An oxide layer may be thermally grown at the cavity side of the membrane portion to reduce the temperature dependence further. This thermal oxide may be connected to the in-plane silicon oxide isolation structures forming a continuous structure surrounding the membrane portion. Silicon oxide is a good diffusion barrier for some dopants like phosphorus and this may prevent the leakage of dopants to the substrate portion, improving electrical isolation, while creating a well-controlled dopant profile in the membrane portion. An additional benefit may be that with only small regions of silicon being doped, minimal net stress in the wafer may be generated compared to doping the full surface, since the doping of silicon is known to change the effective lattice constant of silicon. Furthermore, adding oxide underneath the heavily doped membrane portion (which may act as the bottom electrode) instead of between the electrode 506a, 506b and the piezoelectric layer 504a, 504b may reduce the chance of charge trapping in oxides. Trapped charges may accumulate causing an unwanted deviation in the resonant frequency of the device.

While FIGS. 4 and 5 illustrate resonators with a support including silicon, it may be envisioned that resonators may alternatively have a support, i.e. a membrane portion and a support portion including germanium. The one or more electrical isolation structures, and the oxide layer adjoining the cavity may include germanium oxide. The oxide spacers may also include germanium oxides.

In order to predict the TCF and output response of different resonators, FE modelling was deployed using COMSOL Multiphysics. The FE model was built with a layered stack, which may include a single crystalline silicon support at the bottom, a top metal patterned to form interdigitated transducers (IDTs) and a piezoelectric layer sandwiched between the top and bottom layers. The elastic constants of single crystalline silicon were varied in accordance to both doping concentrations and temperatures, while the elastic constants for piezoelectric material were varied as a function of temperature only. Since literature values were not available for the high silicon doping concentrations (>1e20 cm$^{-3}$) used in this work, the elastic constants variation with temperature was been extrapolated from available data at lower concentrations. To determine the TCF of a resonator, an eigenmode study was adopted where the resonant frequency corresponding to a particular mode shape was tracked while the temperature (T) was varied from −40° C. to +85° C. Such an analysis had been performed for a particular resonator aligned to the <110> and <100> crystal axes of a (100) surface single crystal silicon wafer for determining TCF reduction. The <110> and <100> axes of (100) silicon typically form the bounds of in-plane resonators. Note that the relative resonant frequency deviation ($\Delta f/f_0=[f(T)-f_0]/f_0$) had been determined with respect to the resonant frequency ($f_0$) at room temperature (considered herein as the reference temperature) of $T_0=25°$ C.

Figure 6:
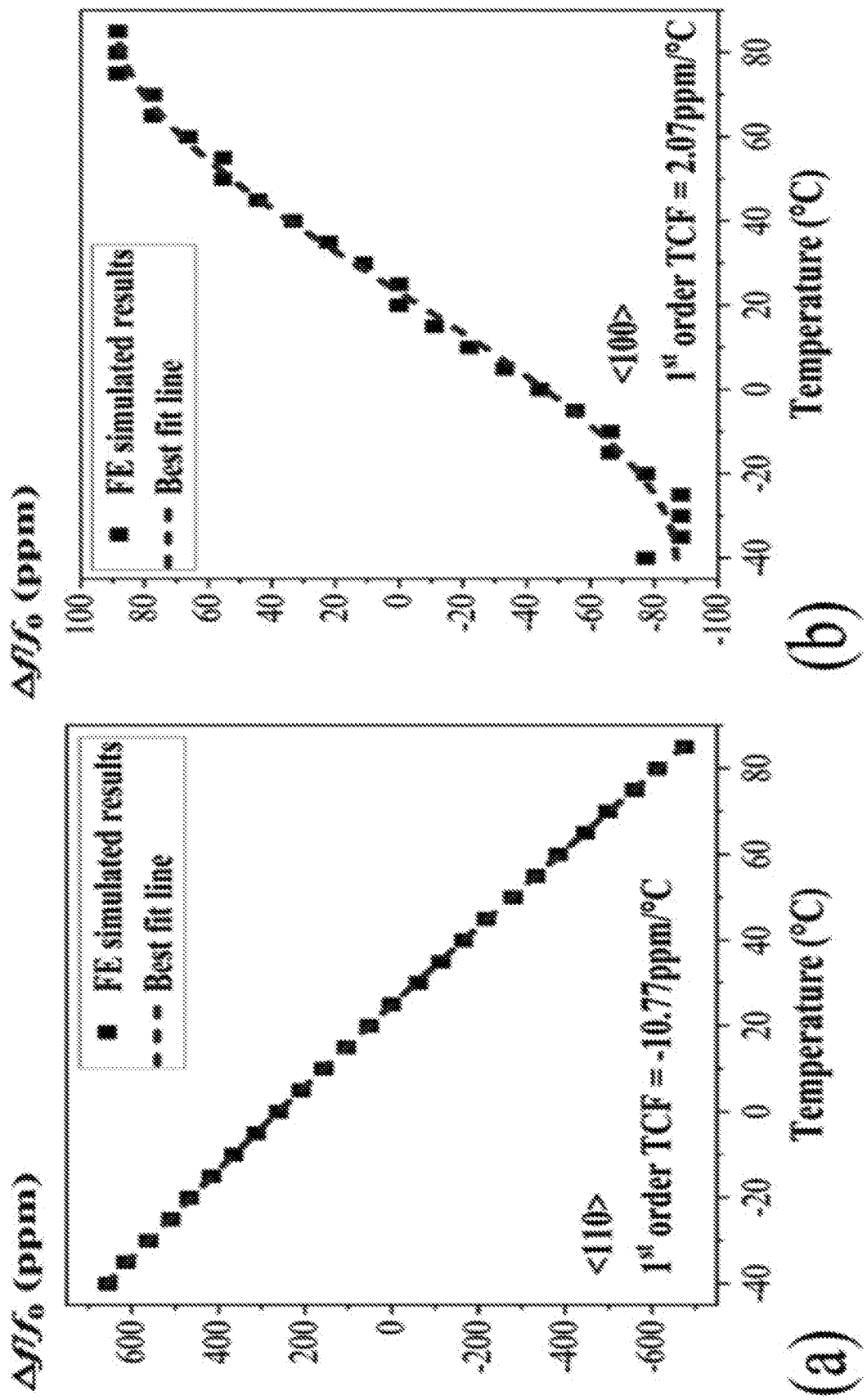
FIG. 6 shows (a) a plot of the relative change in resonant frequency (in parts per million or ppm) as a function of temperature (in degrees Celsius or ° C.) illustrating the simulated results of a contour mode resonator with the central axis aligned to a <110> crystal axis of a single crystal silicon layer according to various embodiments; and (b) a plot of the relative change in resonant frequency (in parts per million or ppm) as a function of temperature (in degrees Celsius or ° C.) illustrating the simulated results of a contour mode resonator with the central axis aligned to a <100> crystal axis of a single crystal silicon layer according to various embodiments.

FIG. 6 shows (a) a plot of the relative change in resonant frequency (in parts per million or ppm) as a function of temperature (in degrees Celsius or ° C.) illustrating the simulated results of a contour mode resonator with the central axis aligned to a <110> crystal axis of a single crystal silicon layer according to various embodiments; and (b) a plot of the relative change in resonant frequency (in parts per million or ppm) as a function of temperature (in degrees Celsius or ° C.) illustrating the simulated results of a contour mode resonator with the central axis aligned to a <100> crystal axis of a single crystal silicon layer according to various embodiments.

The contour mode resonator corresponds to that shown in FIG. 3(a). The simulated results in FIG. 6 were also been fitted with the analytical prediction from equation (4) to determine the 1st order TCF values. Simulated results in FIG. 6 clearly show more than 5 times reduction when the central axis of the contour mode MEMS resonator is aligned to <100> crystal axis compared to <110> crystal axis. Moreover, it is expected that the total temperature variation of frequency may be reduced further by adjusting the silicon layer thickness appropriately, or by a slight variation of angle of orientation, e.g. within ±5°, around the <100> crystal axis.

Next, the output impedance characteristics of the MEMS resonators were simulated using frequency domain study around the resonant frequency obtained from eigenmode analysis. In order to place the IDTs on the piezoelectric layer of a contour mode MEMS resonator (from FIG. 3(a)), the strain profile of the resonator is plotted along x-axis in FIG. 7(a).

Figure 7:
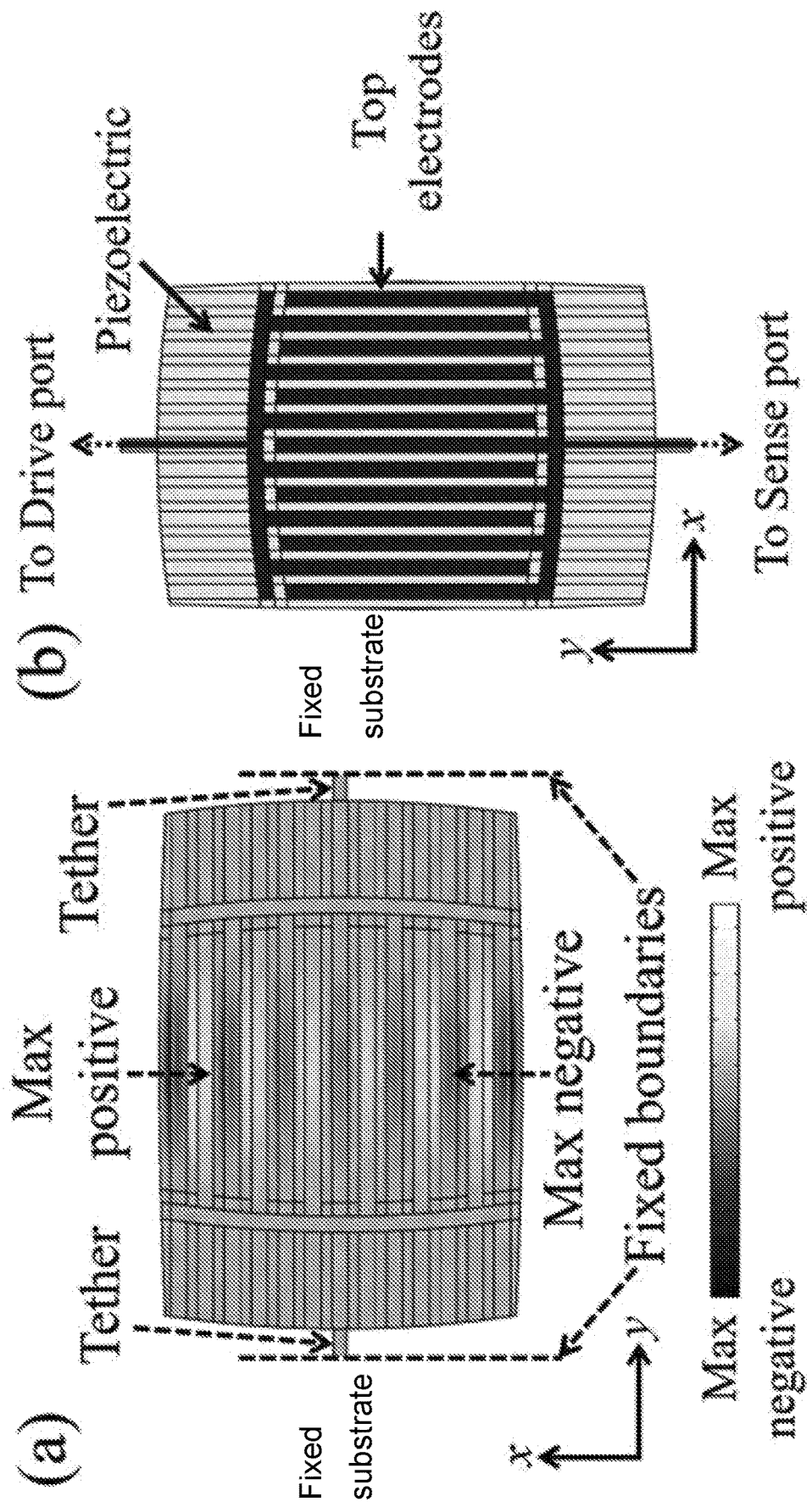
FIG. 7 shows (a) the strain distribution along the x-axis associated with the contour mode resonator of FIG. 3(a) according to various embodiments; and (b) the active device area of the contour mode resonator (supported by two tethers) with the top metal electrodes configured as drive and sense electrodes separately according to various embodiments.

FIG. 7 shows (a) the strain distribution along the x-axis associated with the contour mode resonator of FIG. 3(a) according to various embodiments; and (b) the active device area of the contour mode resonator (supported by two tethers) with the top metal electrodes configured as drive and sense electrodes separately according to various embodiments.

Figure 8:
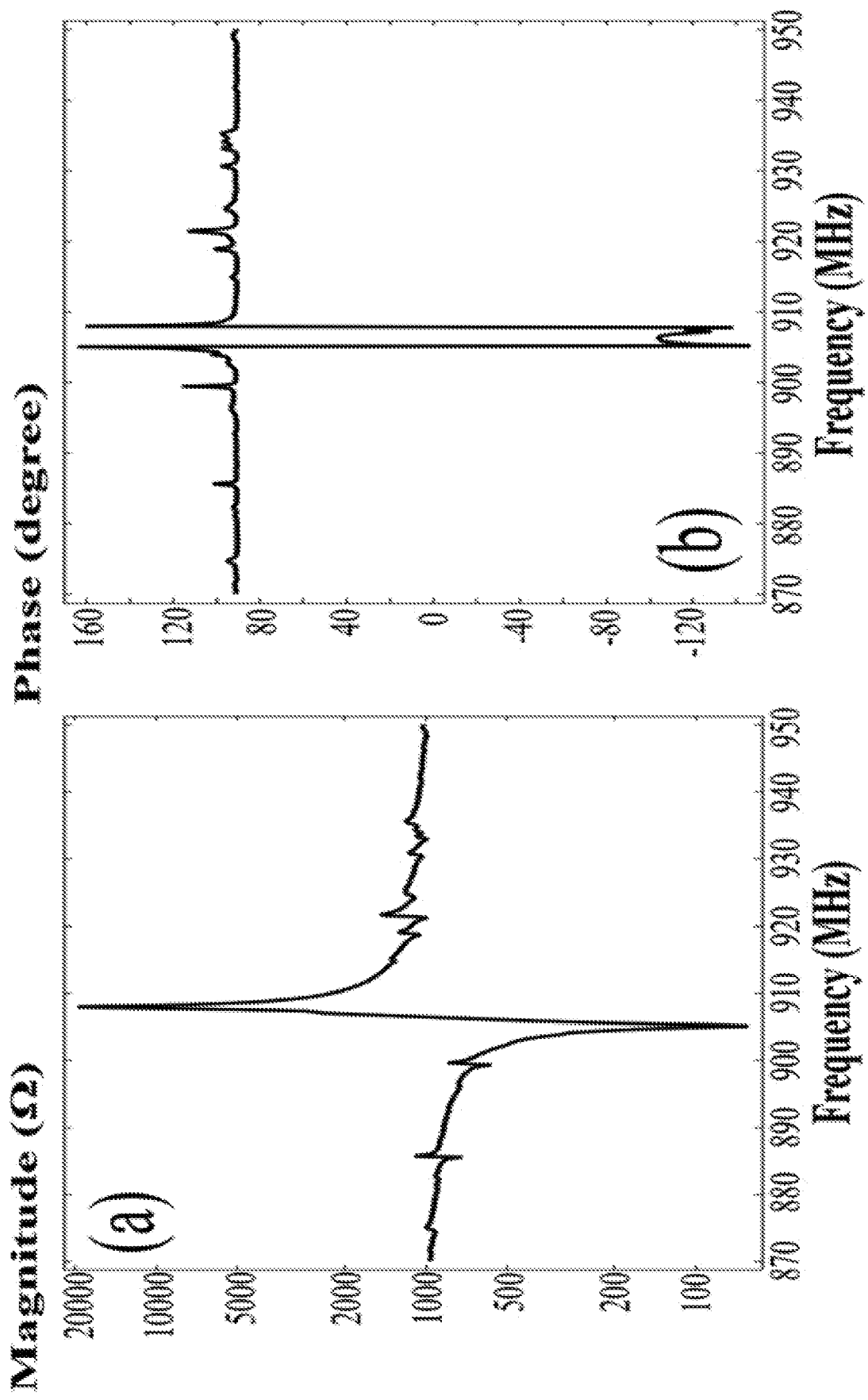
FIG. 8 shows (a) a plot of output impedance magnitude (in ohms or Ω) as a function of frequency (in megahertz or MHz) showing the finite element (FE) simulated magnitude as frequency is swept around the resonance of the contour mode resonator according to various embodiments; and (b) a plot of output impedance phase (in degrees) showing the FE simulated phase as frequency is swept around the resonance of the contour mode resonator according to various embodiments.

An electric field was created across the piezoelectric layer in COMSOL Multiphysics by applying a voltage on the top layer of piezoelectric material which coincided with the drive electrodes while the bottom layer of piezoelectric material remained grounded. The output response as a function of frequency, which is shown in FIG. 8, was obtained from the sense electrodes while the temperature was kept constant at the reference temperature ($T_0=25°$ C.). FIG. 8 shows (a) a plot of output impedance magnitude (in ohms or $\Omega$) as a function of frequency (in megahertz or MHz) showing the finite element (FE) simulated magnitude as frequency is swept around the resonance of the contour mode resonator according to various embodiments; and (b) a plot of output impedance phase (in degrees) showing the FE simulated phase as frequency is swept around the resonance of the contour mode resonator according to various embodiments. The geometry of the resonator may be tuned to reduce the occurrence of spurious/unwanted modes in the vicinity of the resonance of interest.

As mentioned earlier, the resonators may be fabricated on a support including a pre-released single crystalline silicon membrane, which is obtained by a silicon migration process. The silicon migration process involves diffusion of silicon atoms at high temperature under hydrogen environment to produce a defect-free and stress-free single crystalline silicon membrane which is separated from the silicon substrate by a pre-formed cavity. In order to initiate the diffusion process, the silicon substrate may be dry-etched to form an array of pillars separated by trenches. After the silicon migration process, the support including a membrane portion and a substrate portion defining a buried cavity may be formed.

Figure 9A:
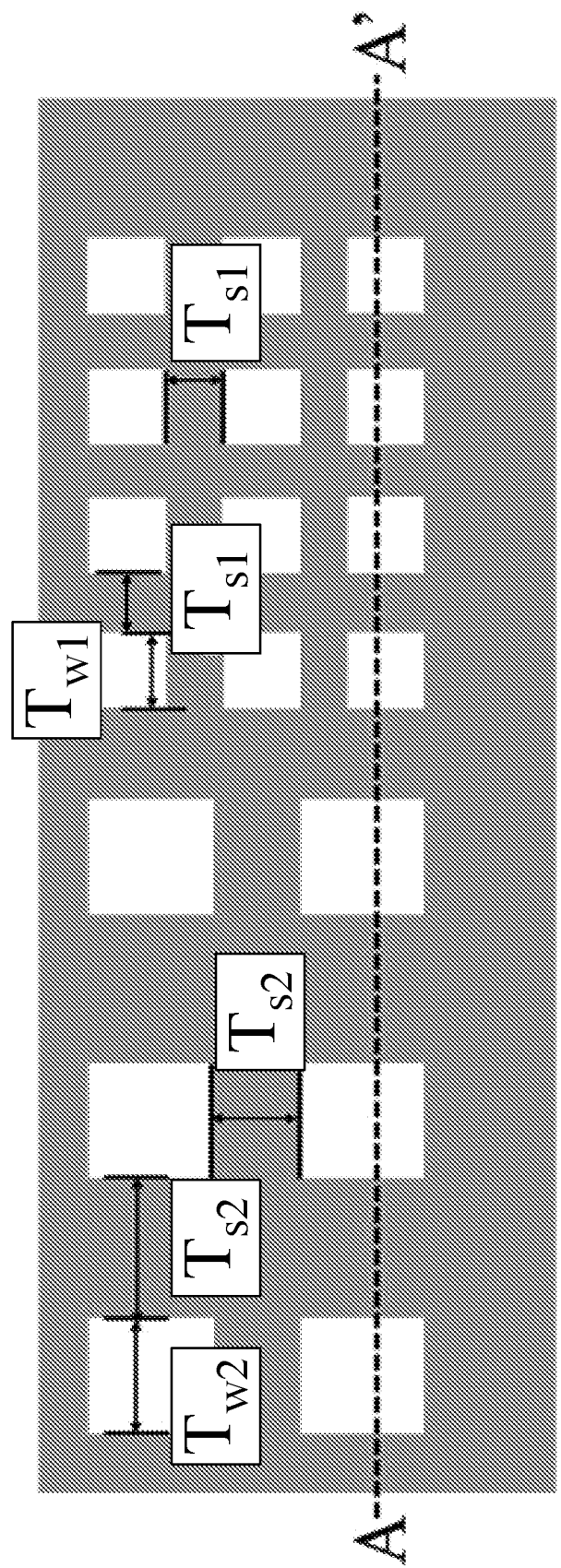
FIG. 9A shows a schematic of a top view of a silicon substrate etched to form an array of pillars according to various embodiments.
Figure 9B:
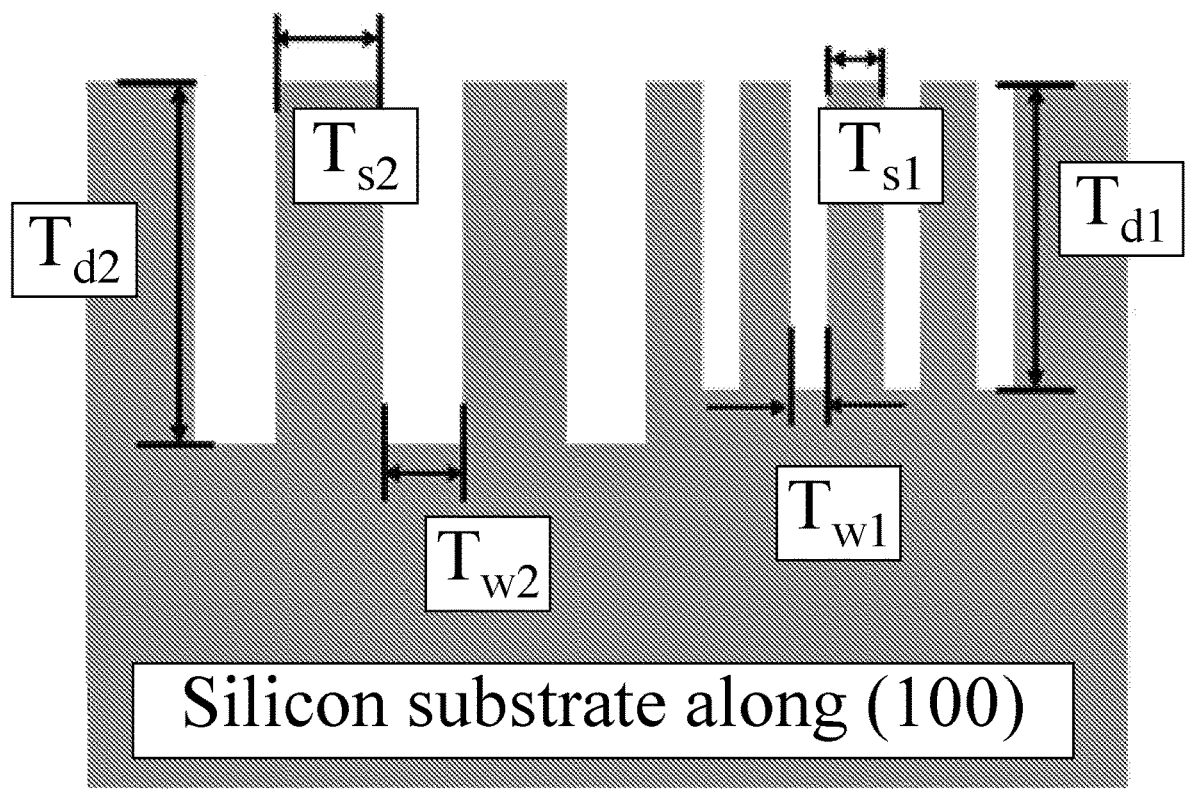
FIG. 9B is a schematic of a cross-section view of the silicon substrate shown in FIG. 9A (corresponding to line AA') being etched according to various embodiments.
Figure 9C:
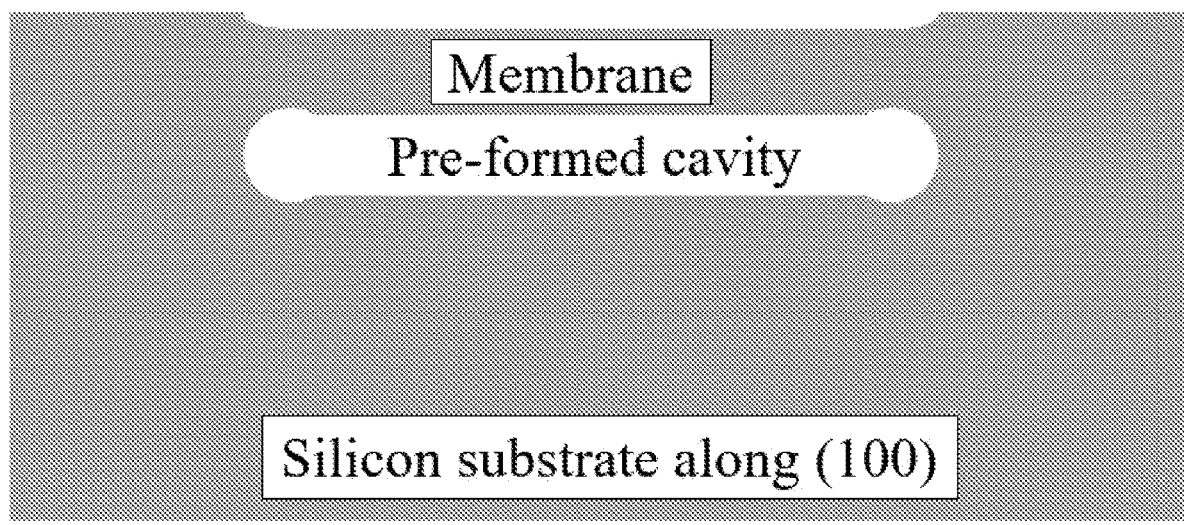
FIG. 9C is a schematic of the silicon membrane portion suspended on the silicon substrate portion and separated by a cavity as obtained after silicon migration process according to various embodiments.

FIG. 9A shows a schematic of a top view of a silicon substrate etched to form an array of pillars according to various embodiments. FIG. 9B is a schematic of a cross-section view of the silicon substrate shown in FIG. 9A (corresponding to line AA') being etched according to various embodiments. FIG. 9C is a schematic of the silicon membrane portion suspended on the silicon substrate portion and separated by a cavity as obtained after silicon migration process according to various embodiments.

It may be noted that the thickness of both silicon membrane and the bottom cavity can be tuned by varying the ratio between the trench opening ($T_w$) and spacing between trenches ($T_s$) while keeping the etch rate intact. While FIGS. 9A and 9B relate to forming a silicon membrane portion and a silicon substrate portion based on a silicon substrate, such as a silicon wafer, it may be envisioned that the processes shown in FIGS. 9A and 9B may also be applicable to forming a germanium membrane portion and a germanium substrate portion based on a germanium substrate, such as a germanium wafer.

Figure 10A:
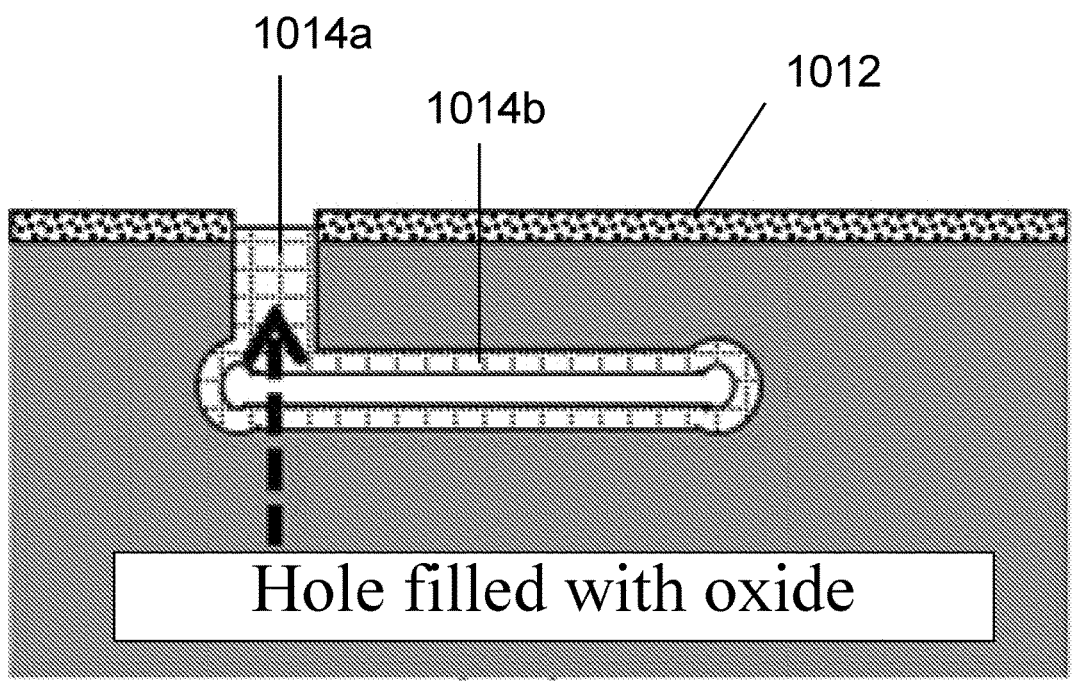
FIG. 10A shows the growth of a local thermal oxide on a part of the silicon membrane portion according to various embodiments.

FIG. 10A shows the growth of a local thermal oxide on a part of the silicon membrane portion according to various embodiments. After the support 1002 with the membrane portion is formed, the membrane portion (or the active device layer) can be masked with a suitable masking material 1012, e.g. silicon nitride, to grow a local thermal oxide 1014a on a part of the silicon membrane portion. Since the oxidation of silicon creates a thicker layer of silicon oxide compared to the original silicon membrane portion, the silicon to be oxidized may first be recessed by etching prior to oxidation. This may also help in speeding up the oxidation process, which tends to be diffusion limited with the oxidation rate slowing with thickness. Since silicon is a much better gas diffusion barrier compared to silicon oxide, once the oxidizing gas (e.g. water vapor or oxygen) diffuses through the grown silicon oxide layer into the cavity, the internal surfaces of the cavity will be oxidized, thus forming the thermally grown bottom oxide layer 1014b in portions of the support 1002 adjoining the cavity. Alternatively, a small vent may be first patterned in the membrane portion to allow for pressure equalization. This vent may be sealed during the oxidation process due to the extra volume created during oxidation. The local thermal oxide 1014a on the back of the membrane portion may be an electrical isolation structure used for passive tuning of the 2nd order TCF and may also function to restrict dopant diffusion into the substrate during the subsequent steps.

Figure 10B:
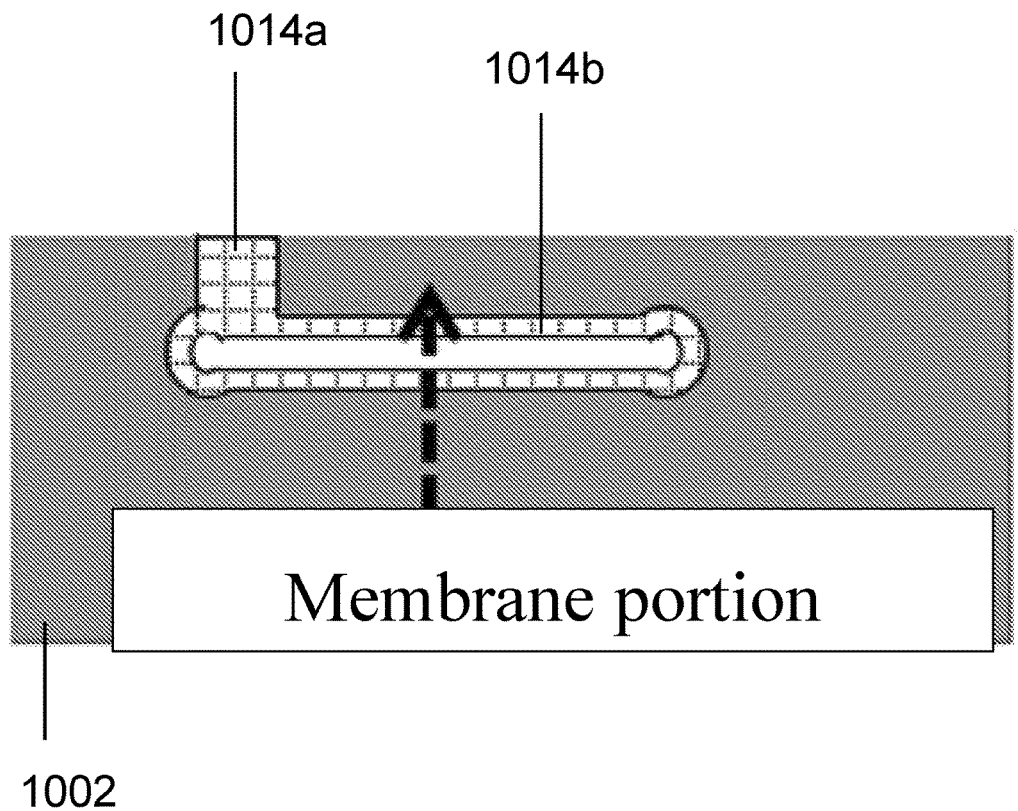
FIG. 10B shows the support after the masking material is stripped off according to various embodiments.
Figure 10C:
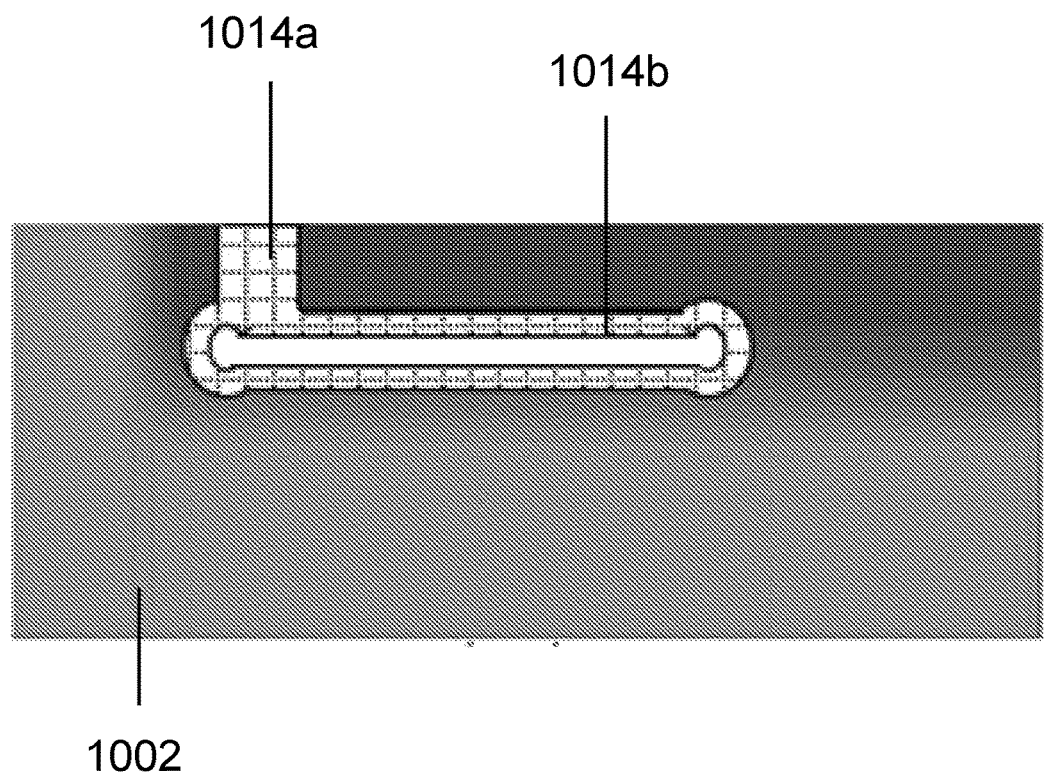
FIG. 10C shows the membrane portion of the support being heavily doped with n-type phosphorous dopants via a diffusion process according to various embodiments.

FIG. 10B shows the support 1002 after the masking material 1012 is stripped off according to various embodiments. FIG. 10C shows the membrane portion of the support 1002 being heavily doped with n-type phosphorous dopants via a diffusion process according to various embodiments. The doping of the membrane portion may reduce the variation of resonant frequency with temperature.

During the diffusion process the thermally grown silicon oxide from the previous steps provides the necessary masking for the regions outside the active/membrane areas and may limit the dopant diffusion in the substrate portion. The heavily doped n-type silicon device layer (i.e. membrane portion) may act as the bottom electrode. However, the same fabrication method can be deployed for resonators with a separate bottom metal electrode by adding dedicated steps for the bottom metal electrode deposition and patterning. Moreover, the dopant diffusion may form a highly resistive p-n junction between the active device layer (i.e. membrane portion) and the substrate portion where no oxide has been grown. This may allow for devices to be electrically isolated, whether by having a highly resistive silicon substrate or by having the silicon between electrically grounded.

Figure 10D:
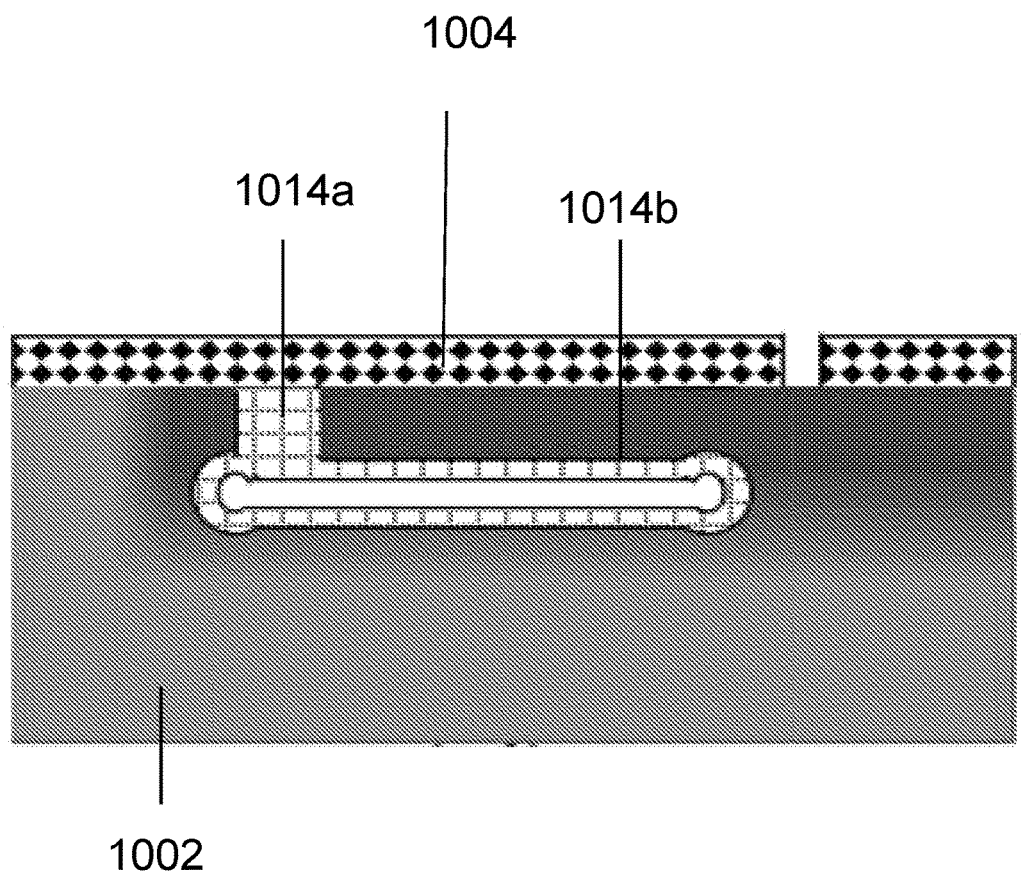
FIG. 10D shows the deposition of piezoelectric material to form a piezoelectric layer or thin film on the support according to various embodiments after the diffusion process.

FIG. 10D shows the deposition of piezoelectric material to form a piezoelectric layer or thin film 1004 on the support 1002 according to various embodiments after the diffusion process. A via may be opened to the bottom electrode (i.e. silicon membrane portion).

Figure 10E:
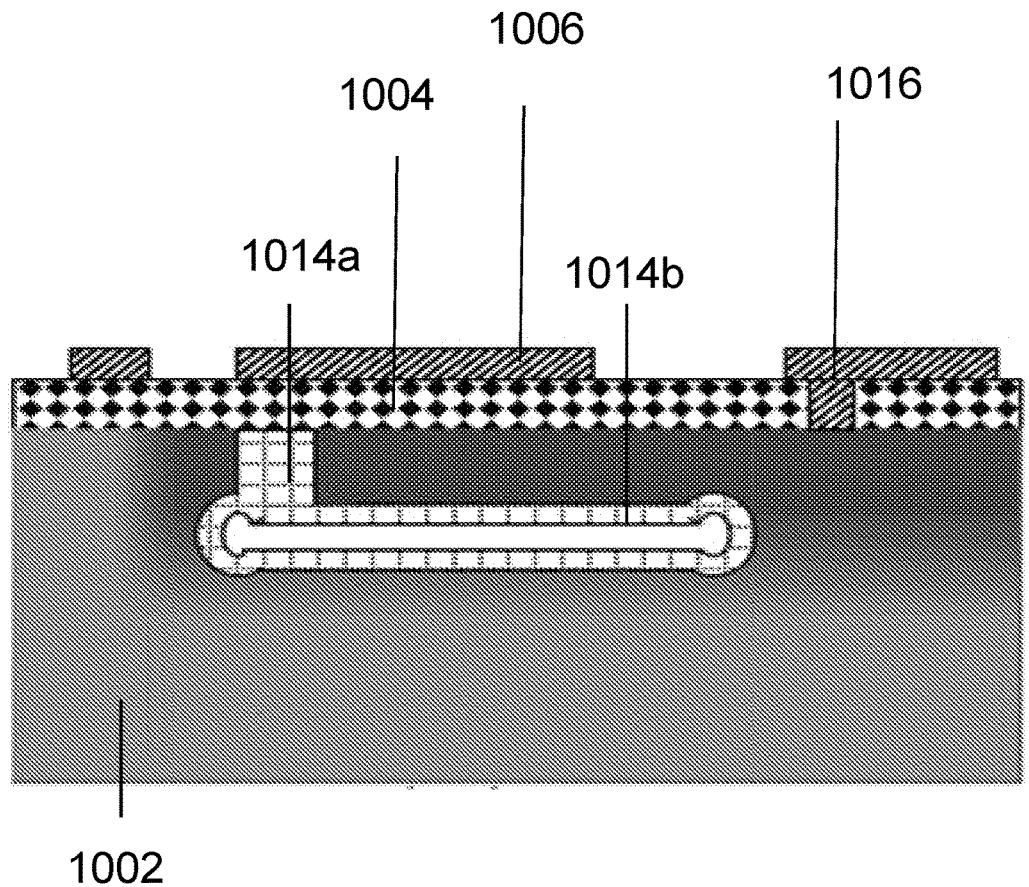
FIG. 10E shows the deposition and patterning of top metal to form the top electrodes according to various embodiments.

FIG. 10E shows the deposition and patterning of top metal to form the top electrodes 1006 according to various embodiments. The patterning of the top metal may also form metal connections 1016, which are used to connect to the bottom electrode (i.e. silicon membrane portion) using the via formed as shown in FIG. 10D.

Figure 10F:
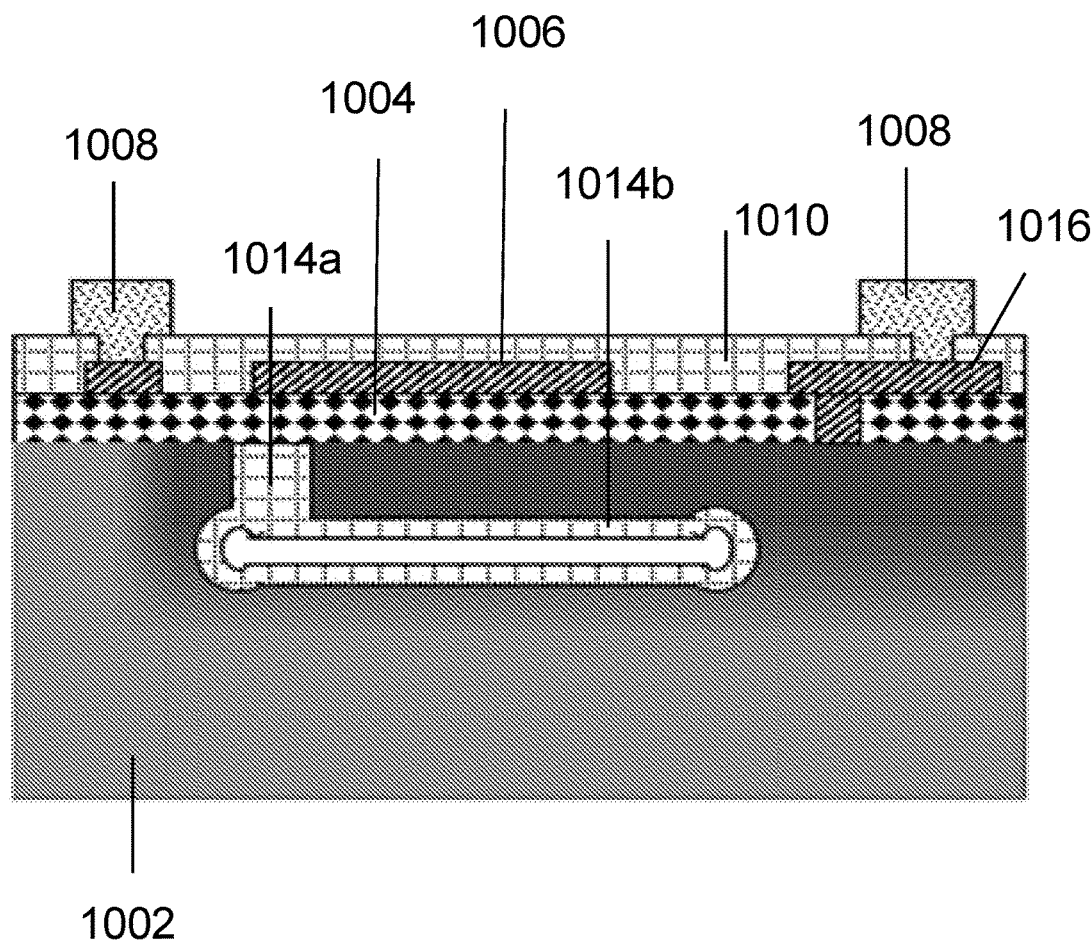
FIG. 10F shows the forming of metal bond pads and silicon oxide spacers according to various embodiments.

FIG. 10F shows the forming of metal bond pads 1008 and silicon oxide spacers 1010 according to various embodiments. A layer of silicon oxide layer may be deposited and etched to form the silicon oxide spacers 1010. The etching of the layer of silicon oxide layer forms vias to access the metal connections 1016 underneath the layer of silicon oxide. The silicon oxide spacers 1010 may mask the active device area during the deposition and etching of metal to form the metal bond pads 1008. FIG. 10G shows the removal of a portion of the silicon oxide spacers 1010 to expose the top electrode 1006 according to various embodiments. The removal of the potion of the silicon oxide spaces 1010, e.g. via etching, may also reveal the active area of the device.

Figure 10H:
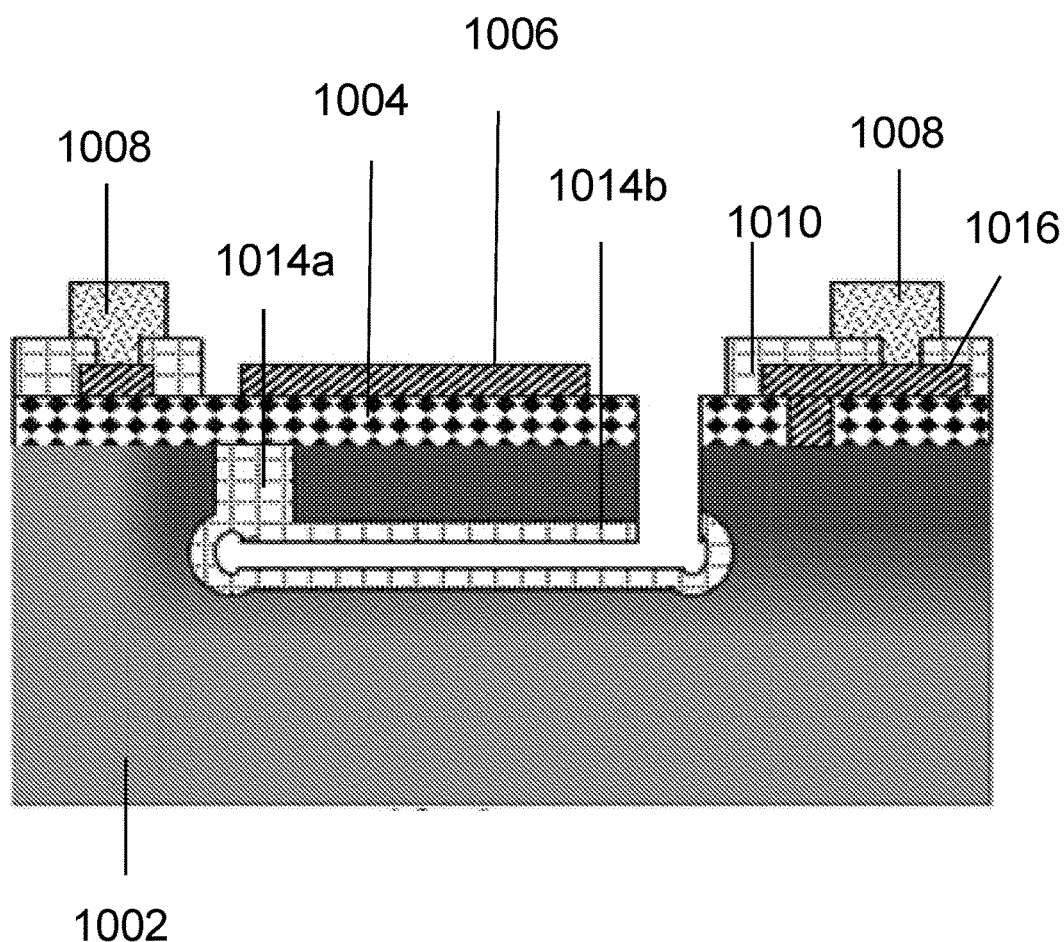
FIG. 10H shows the etching of the piezoelectric layer, the silicon membrane portion and the oxide layer under the silicon membrane portion and adjoining the cavity according to various embodiments.

FIG. 10H shows the etching of the piezoelectric layer 1004, the silicon membrane portion and the oxide layer under the silicon membrane portion and adjoining the cavity according to various embodiments. The membrane portion may remain attached to the substrate portion with at least one anchor. FIG. 10H shows the cross-sectional view of the final form of the piezoelectric-on-silicon MEMS resonator.

While FIGS. 10A-H relate to fabrication processes using a silicon support including a silicon membrane portion and a silicon substrate portion, it may be envisioned that the processes are also applicable to a germanium support including a germanium membrane portion and a germanium substrate portion.

Figure 10I:
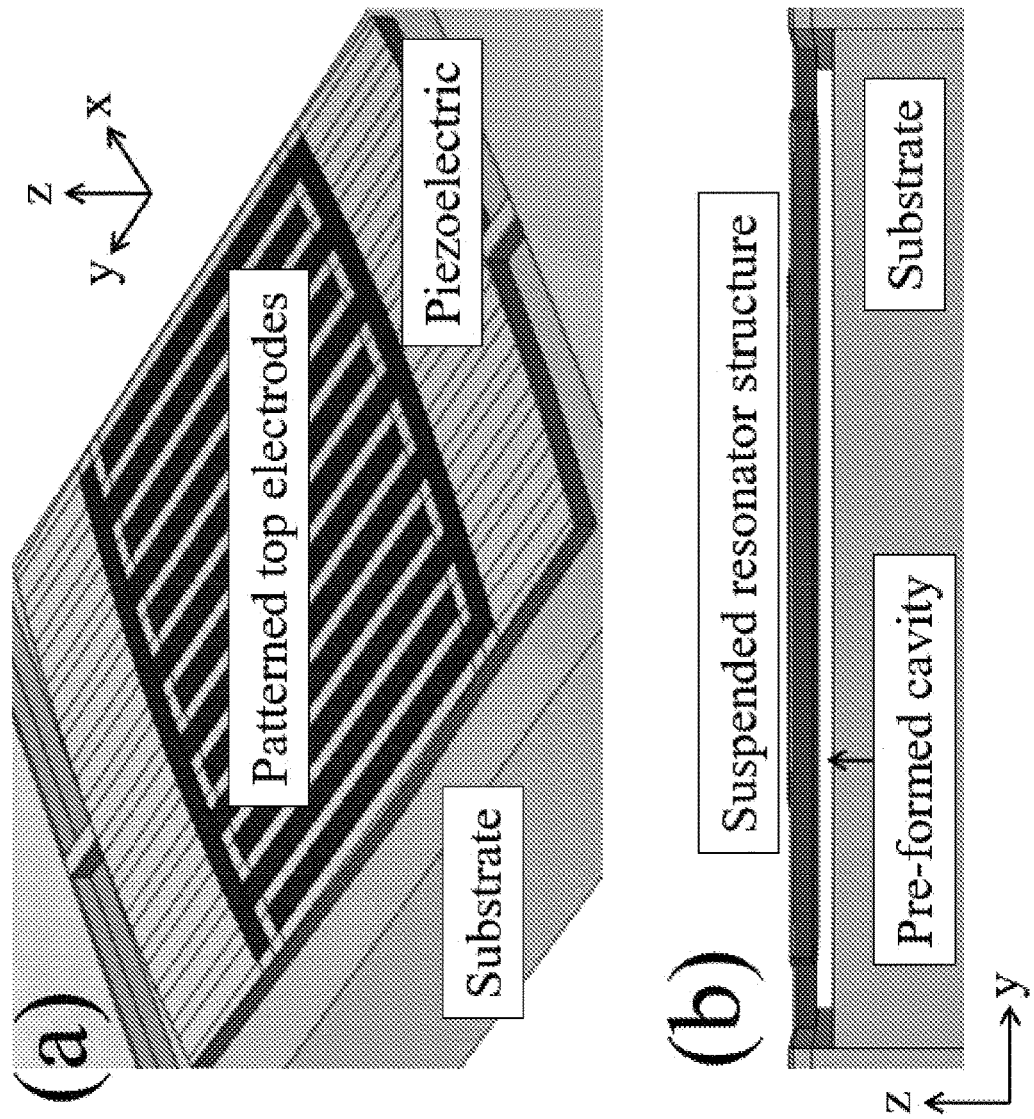
FIG. 10I shows (a) a three-dimensional (3-D) schematic of a contour mode resonator according to various embodiments; and (b) a two-dimensional (2-D) schematic showing the pre-formed cavity underneath the suspended resonator structure according to various embodiments.

FIG. 10I shows (a) a three-dimensional (3-D) schematic of a contour mode resonator according to various embodiments; and (b) a two-dimensional (2-D) schematic showing the pre-formed cavity underneath the suspended resonator structure according to various embodiments. As shown in FIG. 10I, the suspended resonator structure including the membrane portion, the piezoelectric layer and the electrode may be attached to the substrate portion with a pair of anchors/tethers.

Electrical characterization of the fabricated resonators was conducted inside a vacuum probe station with ground-signal-ground (GSG) probes. The GSG probes were calibrated with a standard short-open-load-through (SOLT) configuration before probing the resonators. A typical two-port configuration was adopted to measure the transmission ($S_{21}$) of the resonators using a vector network analyzer where the frequency was swept around resonance of each device.

Figure 11:
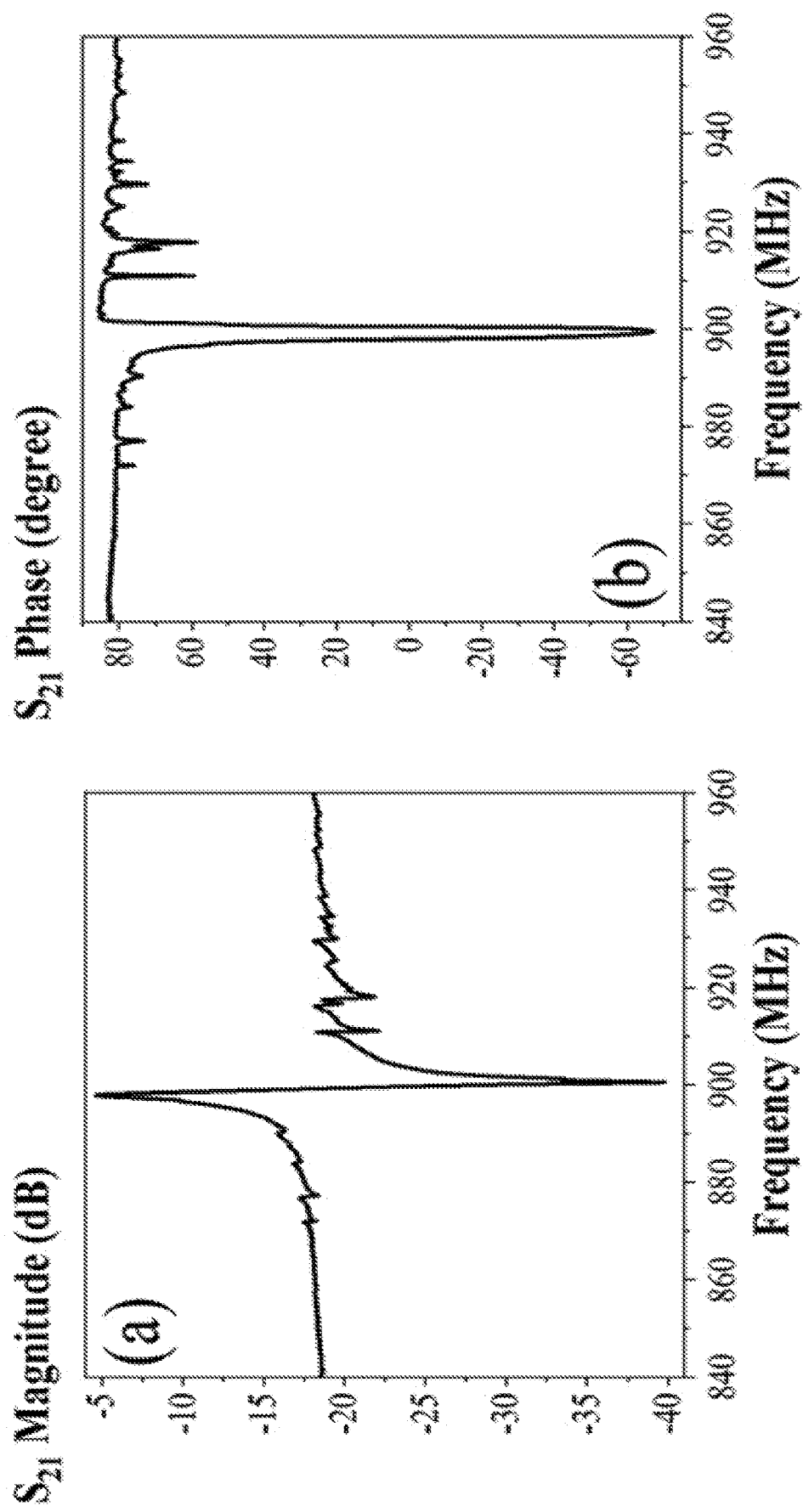
FIG. 11 shows (a) a plot of magnitude (in decibels or dB) as a function of frequency (in megahertz or MHz) showing the measured $S_{21}$ transmission magnitude of the fabricated contour mode resonator according to various embodiments at 25.3° C. under vacuum; and (b) a plot of phase (in degrees) as a function of frequency (in megahertz or MHz) showing the measured $S_{21}$ transmission phase of the fabricated contour mode resonator according to various embodiments at 25.3° C. under vacuum.

FIG. 11 shows (a) a plot of magnitude (in decibels or dB) as a function of frequency (in megahertz or MHz) showing the measured $S_{21}$ transmission magnitude of the fabricated contour mode resonator according to various embodiments at 25.3° C. under vacuum; and (b) a plot of phase (in degrees) as a function of frequency (in megahertz or MHz) showing the measured $S_{21}$ transmission phase of the fabricated contour mode resonator according to various embodiments at 25.3° C. under vacuum.

Figure 12:
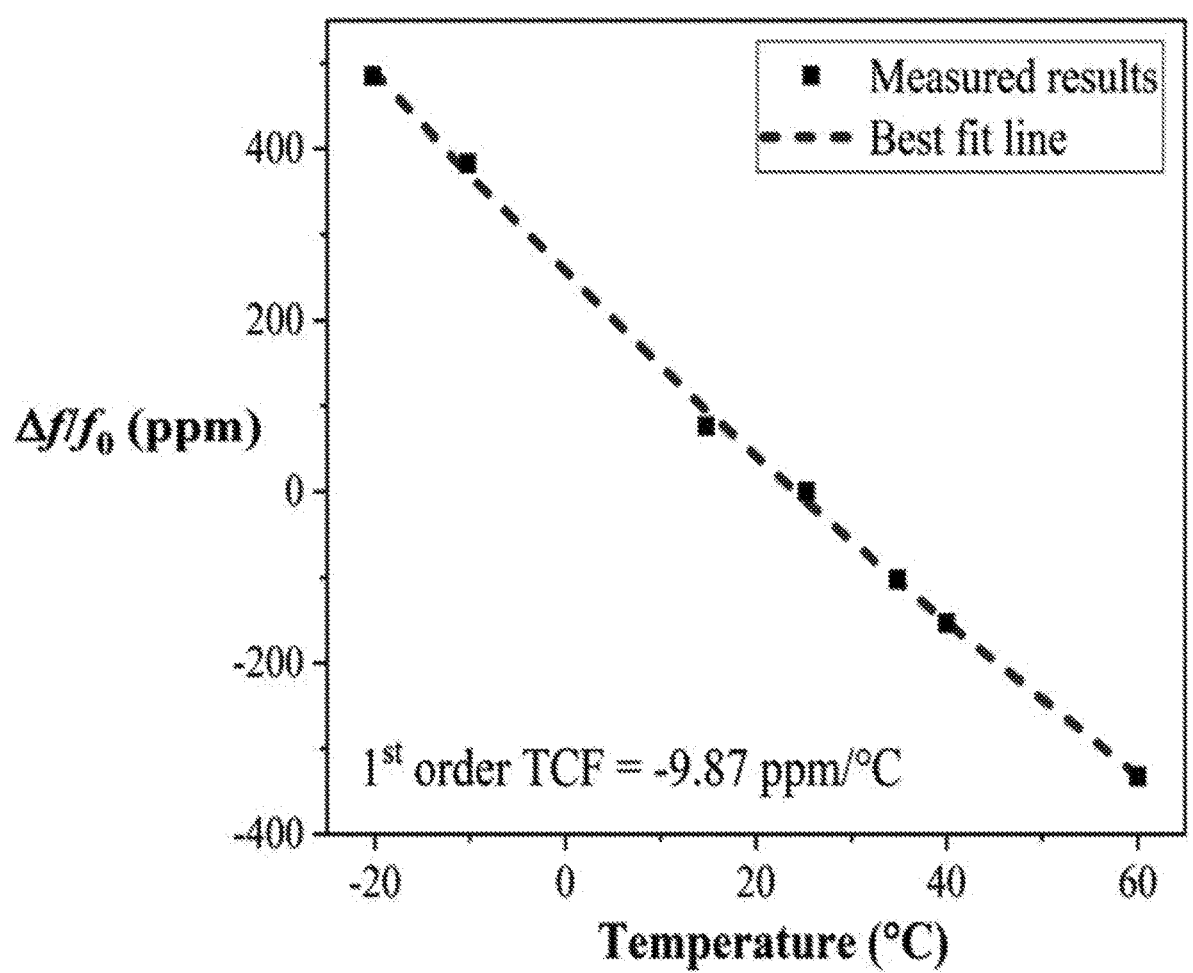
FIG. 12 shows a plot of relative shift in resonant frequency $\Delta f/f_0$ (in parts per million or ppm) as a function of temperature (in degrees Celsius or ° C.) showing the measured relative shift of the fabricated resonator according to various embodiments along (100).

To measure the TCF of the above resonator, frequency responses were measured while the operating temperature inside the probe station was swept by a temperature controller placed outside the probe station. During temperature sweep, vacuum was maintained inside the probe station. The temperature inside the probe station was varied from −20° C. to +60° C. at a specific interval. For every temperature (T) value, the corresponding resonant frequency (f(T)) of the device was extracted from the frequency response curve. The relative shift in resonant frequency ($\Delta f/f_0$) in FIG. 12 was obtained from subtracting the resonant frequency ($f_0$) at $T_0$=25.3° C. (considered herein as room temperature) from the resonant frequency at each temperature value and dividing the difference by the resonant frequency ($f_0$) at $T_0$=25.3° C. FIG. 12 shows a plot of relative shift in resonant frequency $\Delta f/f_0$ (in parts per million or ppm) as a function of temperature (in degrees Celsius or ° C.) showing the measured relative shift of the fabricated resonator according to various embodiments along (100). The ratio of various layers may be tuned to achieve close to zero TCF. A model curve based on Equation (4) was fitted to yield a $1^{st}$ order TCF value ($TCF_1$) of −9.87 ppm/° C.

The 1st order TCF has shown much more than 3 times reduction compare to the 1st order TCF of conventional thin-film piezoelectric-on-silicon resonators (±30 ppm/° C.). Measured TCF value is higher compared to the FE simulated TCF value of the resonator stack, which can be attributed to the variation in doping concentration and the thicknesses of respective layers in the vertical stack. Further investigations are underway to evaluate the doping concentration and thickness of each structural layer in the resonator structure so as to accurately predict the TCF from the finite element model.

Various embodiments relate to a way of fabricating piezoelectric resonators with small footprints on a stress-free pre-released silicon membrane (separated from the substrate by a cavity) in a stable manner without the need for fabricating any other stress relief structures in the vicinity of the membranes as well as no further undercut etch steps to release the structure. The doping concentration can be well controlled for temperature compensation. The tunability of the silicon migration process in varying the thickness of bottom silicon membrane may add flexibility for obtaining membranes with various thicknesses in a single fabrication cycle. Such a method may be useful in reducing the anchor loss by lowering the thickness of the silicon membrane around the anchor/s of the resonators relative to the resonator body. As each structural layer contributes to the overall TCF of the resonator, the tunability of silicon migration process may also allow different frequency resonators which have different optimum thicknesses of the silicon device layer for temperature compensation, while keeping a fixed thickness for the other constituent layers in the resonator structure. Should thicker silicon device layers be required, additional silicon may be grown via epitaxial processes. The electrical isolations described herein may provide a pathway to obtain a highly dense array bank of resonators in a single die while keeping a highly reliable performance for each resonator/device. Finally, the thermally grown oxide underneath the bottom silicon membrane may offer additional opportunity for tuning the 2nd order TCF, while eliminating the risk of charge trapping in oxides, and limiting the dopant drive-in into the substrate region.

Various embodiments may relate to the design and fabrication methodologies of piezoelectric-on-silicon MEMS resonators built from a lightly doped p-type monocrystalline silicon wafer, which are relatively cheaper compared to both silicon-in-insulator (SOI) and C-SOI wafers. The design approach to build piezoelectric-on-silicon MEMS resonators can be beneficial to companies for both high and low frequency platforms. On the other hand, the fabrication method can be adopted in all conventional MEMS fabs. Such a temperature compensation method can also be useful for piezoelectric-on-silicon sensors, such as piezoelectric micromachined ultrasonic transducers (pMUTs) for ultrasonic communication or array purposes, where frequency matching between devices is crucial.

Various embodiments may relate to a resonator including a pre-released monocrystalline silicon or germanium membrane portion serving as the foundation for the fabrication of the remaining constituent layers. The membrane portion/device layer may be in the same plane (along (100) plane) as the silicon substrate. The membrane portion may be continuous with the substrate portion and separated by a cavity underneath. The top surface of the resonator may be recessed (below) from the top surface of the substrate. A minimum height of the cavity underneath the pre-released silicon layer may be 0.8 μm, and the lateral dimension of the resonator may be at least 10 μm. A piezoelectric layer may be sandwiched between the top and bottom electrodes. The resonator may have a small footprint, e.g. 340 μm×360 μm.

The membrane portion may be coplanar with the substrate portion. There may be no further release step after the forming of layers over the membrane portion. The process of forming the membrane portion may add flexibility for varying thicknesses in the membrane portion by tuning the ratio between trench opening and trench pitch. The variation may improve the anchor loss limited Q factor.

In order to reduce at least one of the TCF values (either 1st or 2nd order), the central axis of the resonators may be aligned to <100> crystal axis of bottom silicon, or within an offset of ±θ about the <100> crystal axis. The bottom silicon layer may be heavily doped. A ratio of thickness of silicon to the combined thicknesses of both piezoelectric and metal electrodes may be over 3:1.

To further reduce the 2nd order TCF value, a thermally grown silicon oxide may be added to the bottom of the pre-released silicon membrane, which may limit the n-type dopants drive-in and restrict the n-type dopants diffusion into the substrate. The silicon oxide may also be beneficial in reducing frequency instability due to charge trapping in oxide layer as compared to oxide added on top of silicon device layer. The oxide may be grown in a sealed cavity by diffusion through silicon oxide. Different ratios of hole size to pitch may be used to vary thicknesses.

The thicknesses of the constituent layers may determine the overall TCF of a compound structure. As mentioned above, the thicknesses of the membrane portion may be tuned by varying the trench opening to pitch ratio.

Electrical isolations may be accomplished by highly resistive p-n junctions between n-type heavily doped silicon membrane and p-type substrate. Alternatively, in-plane silicon oxide structures may be fabricated around the membrane portion to eliminate any cross-coupling between neighboring devices. Electrical isolation of bottom electrode may be necessary to avoid cross-coupling with neighboring devices and maintain lower capacitance to ground to provide stable device characteristics with time.

The pre-defined cavity with silicon membrane on-top may be formed from a single crystal silicon substrate (along (100) plane) using silicon migration process, where the silicon migration (also known as silicon-on-nothing) process may be driven by diffusion of silicon surface atoms towards the minimization of surface energy under annealing conditions. The pre-formed silicon membrane may be stress-free and may follow the crystal orientation of the silicon substrate. The thickness of silicon membrane/device layer can be tuned within a single device or across the wafer in the same fabrication cycle. The thicknesses and other dimensions of these membranes can easily be characterized with cross-scanning electron microscopy (cross-SEM).

Thin film piezoelectric-on-silicon resonator usually uses a thick silicon layer. Fabrication on a membrane-on-cavity may be challenging because thin silicon layers may deform under stresses while reducing the silicon layer thickness in C-SOI and SOI wafers. Stress induced deformations may be a bottleneck in both C-SOI and SOI wafers while thinning down the silicon device layer below ~10 μm. As described herein, silicon diffusion under high temperature hydrogen environment may form a defect-free and stress-free monocrystalline silicon membrane-on-cavity.

Thicker silicon layer may be grown via epi process to realize thin-film piezoelectric-on-silicon resonators.

To date, the first fab-run has been completed—further inspection is underway to predict the thicknesses of respective layers, depth of the cavity underneath, doping concentration etc.

Further structural and process modifications may be adopted to lower down the 1st order TCF value down to ~1-2 ppm/° C. MEMS resonators may be later co-fabricated with CMOS circuitry to realize wafer-level temperature compensated oscillators. In-plane oxide isolation structures can be fabricated around each device using local oxidation of silicon (LOCOS) process.

Thermally grown silicon oxide can be added to the bottom of the pre-released silicon membrane (with silicon nitride as mask layer deposited on top of the pre-released silicon membrane) for further reduction of the 2nd order TCF value of the resonators. The intended specifications are as follow:

TABLE 1

| Specs | Target values |
| --- | --- |
| Resonant frequency | Few MHz (flexural mode resonators) to few GHz (contour mode resonators) |
| Motional impedance | Less than 50Ω to few 100Ω |
| $1^{st}$ order TCF | ±10 ppm/° C. (within −40° C. to +85° C.) |
| Unloaded quality (Q) factor | ~500-2000 |
| Footprint (including the bond pads) | ≤0.34 mm × 0.36 mm (with a lower bound for lateral dimension is 10 μm) |

Various embodiments may suppress the first order TCF value to at least ±10 ppm/° C. (within the industrial range of −40° C. to 85° C.). Various embodiments may have reduced anchor thickness to improve the overall Q-factor. Various embodiments may allow higher device density and improved functionality. Various embodiments may have better electrical isolation which improves the device performance. The possibility of thermally growing silicon oxide at the backside of silicon membrane may further reduce the 2nd order TCF of the resonator.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A resonator comprising:
   a support comprising a substrate portion, and a membrane portion extending from the substrate portion over a cavity;
   a piezoelectric layer on the membrane portion; and
   an electrode on the piezoelectric layer;
   wherein the substrate portion comprises dopants of a first conductivity type;
   wherein the membrane portion comprises dopants of a second conductivity type different from the first conductivity type; and
   wherein a ratio of a thickness of the membrane portion to a combined thickness of the electrode and the piezoelectric layer is above 3:1 for temperature compensation.

2. The resonator according to claim 1,
   wherein the support comprises one or more electrical isolation structures separating the substrate portion and the membrane portion.

3. The resonator according to claim 1,
wherein the substrate portion comprising dopants of the first conductivity type and the membrane portion comprising dopants of the second conductivity type form a p-n junction for providing electrical isolation.

4. The resonator according to claim 1,
wherein a region of the substrate portion adjoining the cavity and a region of the membrane portion adjoining the cavity comprises an oxide.

5. The resonator according to claim 1,
wherein a lateral dimension of the membrane portion is of a value of 10 μm or greater; and
wherein a height of the cavity is of a value of 0.8 μm or greater.

6. The resonator according to claim 1,
wherein a thickness of the membrane portion varies along one of the lateral dimensions of the membrane portion.

7. The resonator according to claim 1,
wherein the cavity is at least partially defined by a bottom surface of the membrane portion and a top surface of the substrate portion.

8. The resonator according to claim 1,
wherein the cavity is formed by a silicon-on-nothing process.

9. The resonator according to claim 8,
wherein the silicon-on-nothing process comprises etching trenches from a top surface of a crystalline silicon wafer.

10. The resonator according to claim 8,
wherein the silicon-on-nothing process comprises diffusion of silicon surface atoms under annealing conditions.

11. The resonator according to claim 1,
wherein the resonator is a countour mode resonator.

12. The resonator according to claim 1,
wherein the resonator is a flexural mode resonator.

13. The resonator according to claim 1,
wherein the substrate portion and the membrane portion comprise silicon or germanium.

14. The resonator according to claim 1,
wherein a central axis of the resonator is aligned to a <100> axis of silicon.

15. The resonator according to claim 1,
wherein the membrane portion acts as a further electrode.

16. The resonator according to claim 1, further comprising:
an electrically conductive layer acting as a further electrode;
wherein the piezoelectric layer is between the electrode and the electrically conductive layer.

17. A method of forming a resonator, the method comprising:
forming a support comprising a substrate portion, and a membrane portion extending from the substrate portion over a cavity;
forming a piezoelectric layer on the membrane portion; and
forming an electrode on the piezoelectric layer;
wherein the substrate portion comprises dopants of a first conductivity type;
wherein the membrane portion comprises dopants of a second conductivity type different from the first conductivity type; and
wherein a ratio of a thickness of the membrane portion to a combined thickness of the electrode and the piezoelectric layer is above 3:1 for temperature compensation.

18. The method according to claim 17,
wherein forming the support comprising the substrate portion and the membrane portion comprises using a silicon-on-nothing process on a crystalline silicon wafer.

19. The method according to claim 18,
wherein the silicon-on-nothing process comprises forming an array of pillars via etching; and
wherein the silicon-on-nothing process further comprises annealing the array of pillars such that silicon surface atoms diffuse to form the membrane portion.

20. The method according to claim 17,
wherein a lateral dimension of the membrane portion is of a value of 10 μm or greater; and
wherein a height of the cavity is of a value of 0.8 μm or greater.

* * * * *